US012708953B2

(12) United States Patent
Chao et al.

(10) Patent No.: US 12,708,953 B2
(45) Date of Patent: Aug. 18, 2026

(54) BALL MOUNTING APPARATUS WITH BALL ATTACH VOLUME CONTROL

(71) Applicant: TEXAS INSTRUMENTS INCORPORATED, Dallas, TX (US)

(72) Inventors: Chen Chao, Chengdu (CN); Bo Jiang, Chengdu (CN); Wei Li, Chengdu (CN); Jie Chen, Chengdu (CN); Ruijie Huang, Chengdu (CN); Liang Zheng, Chengdu (CN); Qi Ming Bao, Chengdu (CN); Bin Liu, Shenyang (CN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/385,694

(22) Filed: Oct. 31, 2023

(65) Prior Publication Data

US 2025/0096189 A1 Mar. 20, 2025

(30) Foreign Application Priority Data

Sep. 15, 2023 (WO) ................ PCT/CN2023/119114

(51) Int. Cl.
*B23K 3/06* (2006.01)
*H10W 72/00* (2026.01)

(52) U.S. Cl.
CPC ..... *B23K 3/0623* (2013.01); *H10W 72/01212* (2026.01); *H10W 72/07168* (2026.01); *H10W 72/072* (2026.01)

(58) Field of Classification Search
CPC ..... H01L 2224/742; H01L 2224/81101; H01L 2224/75611; H05K 3/3478; B23K 3/0623
See application file for complete search history.

(56) References Cited

U.S. PATENT DOCUMENTS 5,279,045 A * 1/1994 Odashima ............... H01L 24/11 34/558
5,831,247 A * 11/1998 Hidaka ................ B23K 3/0623 228/41
6,003,753 A * 12/1999 Hwang ................. B25B 11/007 228/41
6,336,581 B1 * 1/2002 Tuchiya ............... B23K 3/0623 228/41
(Continued)

FOREIGN PATENT DOCUMENTS

CN 1846919 A 10/2006
CN 1862895 A 11/2006
(Continued)

OTHER PUBLICATIONS

ISR Search Report, Application No. PCT/CN2023/119114, dated Dec. 21, 2023, 3 pages.

*Primary Examiner* — Keith Walker
*Assistant Examiner* — Carlos J Gamino
(74) *Attorney, Agent, or Firm* — Andrew R. Ralston; Frank D. Cimino

(57) ABSTRACT

An integrated circuit (IC) solder ball mounting apparatus comprises a ball storage unit for storing solder balls, a ball buffer unit configured to receive the solder balls from the ball storage unit in response to one or more pressure-actuated actions, and a gate valve configured to allow the solder balls to transfer to a ball mounting brush configured to place the solder balls onto area array contact structures formed on a wafer containing the integrated circuit.

15 Claims, 22 Drawing Sheets

(56) References Cited

U.S. PATENT DOCUMENTS

| | | | | |
|---|---|---|---|---|
| 6,830,175 | B2 * | 12/2004 | Ito | B23K 1/0016 228/41 |
| 7,896,223 | B2 * | 3/2011 | Honma | H01L 24/11 438/615 |
| 11,247,285 | B1 * | 2/2022 | Collins | B65G 47/1457 |
| 2002/0053591 | A1 * | 5/2002 | Razon | B23K 3/0623 228/258 |
| 2008/0179298 | A1 * | 7/2008 | Nakayama | B23K 1/0056 219/85.21 |
| 2009/0026247 | A1 * | 1/2009 | Sakaguchi | B23K 1/0016 228/6.2 |
| 2010/0213243 | A1 * | 8/2010 | Azdasht | B23K 3/0623 228/41 |

FOREIGN PATENT DOCUMENTS

| | | | | |
|---|---|---|---|---|
| CN | 110740831 | A | | 1/2020 |
| CN | 115922017 | A | | 4/2023 |
| JP | 08236916 | A | * | 9/1996 |
| JP | 09162533 | A | * | 6/1997 |
| JP | 2010010565 | A | | 1/2010 |
| JP | 2011254011 | A | * | 12/2011 |
| KR | 20140123214 | A | | 10/2014 |
| KR | 102059987 | B1 | | 2/2020 |

* cited by examiner

600A

602 FILLING A BALL BUFFER UNIT WITH A SUBSTANTIALLY FIXED QUANTITY OF SOLDER BALLS RECEIVED FROM A BALL STORAGE UNIT FED BY A BALL SUPPLY UNIT, THE BALL STORAGE UNIT OPERATING TO STORE SOLDER BALLS UNTIL EXPELLED BY A PRESSURE-ACTUATED ACTION (e.g., $N_2$-BASED EMISSION), WHEREIN THE BALL BUFFER UNIT IS OPERABLE TO RECEIVE THE SUBSTANTIALLY FIXED QUANTITY OF SOLDER BALLS IN ONE OR MORE PRESSURE-ACTUATED ACTIONS

604 GENERATING A DISPENSE SIGNAL BY A CONTROLLER TO CAUSE THE BALL BUFFER UNIT TO RELEASE THE SUBSTANTIALLY FIXED QUANTITY OF SOLDER BALLS TO A BALL MOUNTING BRUSH CONFIGURED TO PLACE THE SUBSTANTIALLY FIXED QUANTITY OF SOLDER BALLS ONTO AREA ARRAY CONTACT STRUCTURES (e.g., PILLARS, BUMPS, ETC.) FORMED ON ONE OR MORE SEMICONDUCTOR DIES OF A WAFER FOR WAFER-LEVEL PACKAGING (e.g., FAN-IN OR FAN-OUT CONFIGURATION)

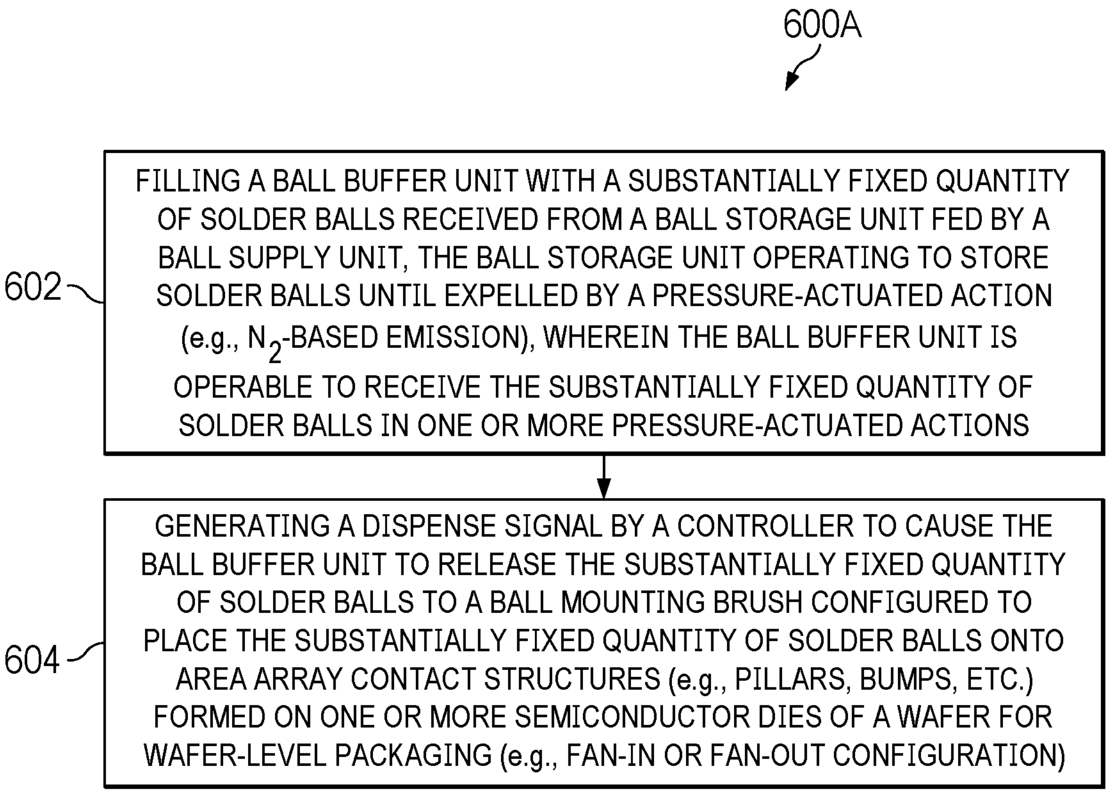

FIG. 6A

BALL MOUNTING APPARATUS WITH BALL ATTACH VOLUME CONTROL

FIELD OF THE DISCLOSURE

Disclosed implementations relate generally to the field of integrated circuit (IC) fabrication and packaging. More particularly, but not exclusively, the disclosed implementations relate to a ball mounting apparatus with ball attach volume control.

BACKGROUND

Wafer-level packaging (WLP), also referred to as chip-scale packaging (CSP), is a type of IC packaging technology that is performed at wafer level, where packaging operations are applied on whole wafers and IC devices on the wafers are diced only after the packaging is successfully completed. In WLP, the components used in assembly (such as bumps, solder balls, etc.) are applied to the wafer pre-dicing, e.g., at wafer level instead of the individual IC die level. In traditional semiconductor manufacturing, the wafers are first diced, or singulated, into separate dies and then are assembled into a suitable semiconductor package such as, e.g., a quad flat no-lead (QFN) package or a ball grid array (BGA) package, to name a few. In addition to the benefits of small size and lower cost, WLP offers integration of wafer fabrication and testing at the wafer level, resulting in a more streamlined manufacturing process, simplifying the overall process flow a device undertakes from the substrate base to the finished shippable customer product. Conventional ball attach systems deployed in WLP applications suffer from various deficiencies, however.

SUMMARY

The following presents a simplified summary in order to provide a basic understanding of some examples of the present disclosure. This summary is not an extensive overview of the examples, and is neither intended to identify key or critical elements of the examples, nor to delineate the scope thereof. Rather, the primary purpose of the summary is to present some concepts of the present disclosure in a simplified form as a prelude to a more detailed description that is presented in subsequent sections further below.

In one example, an integrated circuit (IC) solder ball mounting apparatus is disclosed. The apparatus may comprise, among others, a ball storage unit for storing solder balls; a ball buffer unit configured to receive the solder balls from the ball storage unit in response to one or more pressure-actuated actions; and a gate valve configured to allow the solder balls to transfer to a ball mounting brush configured to place the solder balls onto area array contact structures formed on the integrated circuit.

In one example, a method of forming an IC is disclosed. The method may comprise, among others, receiving a quantity of solder balls in a ball transfer unit of a solder ball handler; moving the solder balls to a ball buffer unit of the solder ball handler, the moving including directing a gas stream into the ball transfer unit; and opening an aperture of the ball buffer unit thereby transferring the quantity of solder balls to a plurality of ball-attach locations of the integrated circuit.

In one example, a solder ball transfer device is disclosed, which may comprise, among others, a path or conduit from a solder ball source to an intermediate solder ball storage volume; a gas flow path or conduit directly connected to the intermediate solder ball storage volume; and a solder ball buffer volume connected between the intermediate solder ball storage volume and an outlet valve, where the solder ball buffer volume is configured to receive solder balls from the intermediate solder ball storage in response to one or more solder ball transfer events that include directing a gas flow to the intermediate solder ball storage volume.

In one example, a method of forming an IC is disclosed, which may comprise, among others, receiving a plurality of solder balls in a first volume connected directly to a gas source; transferring the plurality of solder balls from the first volume to a second volume by directing a gas flow from the gas source to the first volume; and after filling the second volume with solder balls, opening an outlet from the second volume such that the plurality of solder balls are positioned over corresponding solder ball contacts on the integrated circuit.

BRIEF DESCRIPTION OF THE DRAWINGS

Implementations of the present disclosure are illustrated by way of example, and not by way of limitation, in the Figures of the accompanying drawings. It should be noted that different references to “an” or “one” implementation in this disclosure are not necessarily to the same implementation, and such references may mean at least one. Further, when a particular feature, structure, or characteristic is described in connection with an implementation, such feature, structure, or characteristic in connection with other implementations may be feasible whether or not explicitly described.

The accompanying drawings are incorporated into and form a part of the specification to illustrate one or more example implementations of the present disclosure. Various advantages and features of the disclosure will be understood from the following Detailed Description taken in connection with the appended claims and with reference to the attached drawing Figures in which:

FIGS. 6A-6C depict flowcharts according to some example methods of the present disclosure;

DETAILED DESCRIPTION

Figure 1:
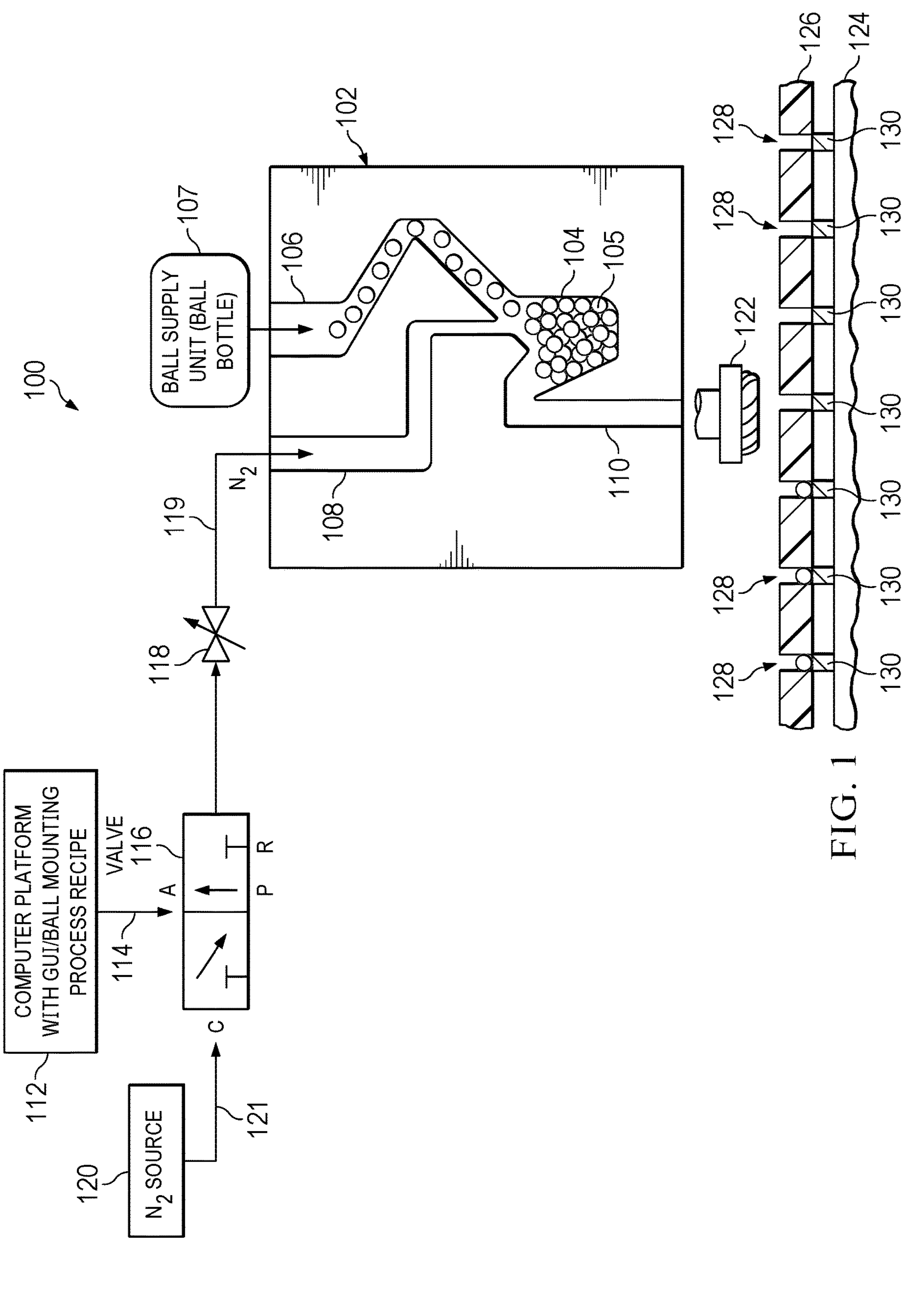
FIG. 1 depicts a baseline ball mounting apparatus having a ball dispenser mechanism configured to dispense solder balls responsive to one or more pressure-actuated actions caused by a corresponding number of dispense signals.

Examples of the disclosure are described with reference to the attached Figures where like reference numerals are generally utilized to refer to like elements. The Figures are not drawn to scale and they are provided merely to illustrate examples. Numerous specific details, relationships, and methods are set forth below to provide an understanding of one or more examples. However, it should be understood that some examples may be practiced without such specific details. In other instances, well-known subsystems, components, structures and techniques have not been shown in detail in order not to obscure the understanding of the examples. Accordingly, the examples of the present disclosure may be practiced without such specific components.

Additionally, terms such as "coupled" and "connected," along with their derivatives, may be used in the following description, claims, or both. It should be understood that these terms are not necessarily intended as synonyms for each other. "Coupled" may be used to indicate that two or more elements, which may or may not be in direct physical or electrical contact with each other, co-operate or interact with each other. "Connected" may be used to indicate the establishment of communication, i.e., a communicative relationship, and/or mechanical engagement or interaction between two or more elements that are coupled with each other. Further, in one or more examples set forth herein, generally speaking, an element, component or module may be configured to perform a function if the element may be programmed for performing or otherwise structurally or mechanically arranged to perform that function.

Without limitation, examples of a solder ball mounting apparatus including a ball dispenser mechanism and related methods will be set forth below in the context of WLP/CSP applications deployed in IC manufacturing.

FIG. 1 depicts a ball mounting apparatus 100 including a ball dispenser mechanism configured to dispense solder balls responsive to one or more pressure-actuated actions caused by a corresponding number of dispense signals according to some baseline deployments. As illustrated, an example baseline ball dispenser mechanism 102 of the ball mounting apparatus 100 may comprise a ball store space or storage unit 104 that is connected to a ball supply unit 107, also referred to as a ball bottle in some examples, by way of a ball supply path or conduit 106 that may be suitably shaped and sized to support the passage of solder balls into the ball store space 104 without impediment or restriction. Ball supply unit 107 is representative of a reservoir configured to contain a large quantity of solder balls (e.g., upwards of millions of solder balls or so depending on the size of the solder balls used in a WLP application, with ball sizes ranging from about 50 microns (μm) to about 400 μm), that is operable for supplying or "feeding" solder balls via the ball supply path 106 to the ball store space 104 under gravity. In some arrangements, the ball supply unit 107 may be configured to supply solder balls in a continuous manner until the unit is empty or otherwise intervened by automated and/or manual control. Depending on application and implementation, the ball supply unit 107 may be periodically replenished in order to maintain a sufficient quantity of solder balls to support WLP operations for a number of wafers per refill, which may comprise semiconductor wafers having IC dies with die pads redistributed in a fan-in configuration or carrier wafers having reconstituted IC dies, e.g., known good dies (KGDs), with die pads redistributed in a fan-out configuration.

The ball dispenser mechanism 102 includes a gas supply path or conduit 108 that receives pressurized gas, typically an inert gas such as $N_2$ that does not react with the solder balls or their coating, via a gas line 119 under control of a valve 116, e.g., a solenoid valve, where the gas line 119 may be provided with a flow meter 118 in some arrangements. Valve 116 is configured to receive one or more control signals 114, referred to as dispense signals, from a computer platform 112 of the ball mounting apparatus 100, based on a suitable ball mounting process recipe that may be provided manually (e.g., by an operator) and/or via automated process control. Although not specifically shown in this Figure, the computer platform 112 may include various user interfaces, e.g., a graphic user interface (GUI), a keyboard, a pointing device, etc., operating under control of one or more processors running appropriate application software for managing the overall operation of the ball mounting apparatus 100. A gas source 120 is configured to provide $N_2$ gas to the valve 116 via a gas line 121, where the valve 116 is operable to open a passageway between the gas lines 119 and 121 responsive to a dispense signal 114 from the computer platform 112, thereby effectuating a path for supplying a volume or stream of gas to the ball store space 104 of the dispenser mechanism 102.

The ball dispenser mechanism 102 includes a ball dispense path or conduit 110 connected to one or more ball mounting brushes 122, where the ball dispense path 110 provides a passageway for the solder balls expelled from the ball store space 104 by a pressure-actuated action caused by a burst of the gas stream supplied via the gas supply path 108 under the control of valve 116. The ball mounting brush(es) 122, which are connected to the ball dispense path 110, may be configured to move laterally as well as rotationally over a stencil 126 having apertures or perforations 128 that are aligned to area array contact structures 130 (also referred to as solder ball contacts) formed on a wafer 124 for each die in a fan-in configuration or a fan-out configuration depending on the packaging application. Upon receiving a quantity of solder balls, e.g., balls 105, expelled from the ball store space 104 under pressure-actuated dispensing action, the ball mounting brush(es) 122 may be actuated to scan across the stencil 126 while releasing the solder balls, where the perforations or holes 128 are dimensioned and aligned to the contact structures 130 and the stencil 126 is positioned in close proximity to the wafer 124 (which may be mounted on a movable platform or stage) such that only a single solder ball is placed on top of a corresponding area array contact structure 130.

In operation, for a given wafer having a total of N area array contact structures for providing electrical contact with a plurality of IC dies therein, the number of ball dispense signals required may be calculated as N/q, where q is the quantity of solder balls in the ball store space 104 when filled with solder balls of a particular size required for the WLP application. Because the solder balls are expelled by pressure-actuated actions, there may be considerable variation in the actual quantities of balls dispensed from the ball store space 104 due to any pressure variation in the gas supply unit 120 itself and/or in the gas supply system, e.g., including lines 119/121, as well as any flow control systems, that may develop over time due to various causes such as seal leaks, mechanical fatigue, process flow control variability, etc., to name a few. Although the number of dispense signals may be increased in order to ensure that enough balls are dispensed for a wafer, it may lead to an oversupply of solder balls, many of which may go unused, thereby causing ball wastage. On the other hand, not having enough solder balls dispensed because of reduced pressure may require the wafers to be reworked, or "rewashed", in order to ensure that any area array contact structures missing the solder balls in a first pass receive the balls in subsequent passes of ball mounting, which leads to process inefficiency.

Examples of the present disclosure recognize the foregoing shortcomings and accordingly provide a ball dispenser mechanism that is based on a dual action "fill and release" principle where a fill action for filling a ball buffer tank or unit having a pre-calibrated volume with a substantially fixed quantity of solder balls is decoupled from a release action for dispensing the solder balls by way of two independently controlled valve mechanisms as will be set forth in detail further below. Depending on implementation, a ball mounting apparatus including a ball dispenser based on the dual action principle according to some examples may be configured to dispense stable quantities of solder balls for different ball size applications, e.g., from about 50 μm to about 400 μm, without limitation, using suitably sized ball buffer tanks or containers, where the ball count variation is expected to be less than ±2% or thereabouts regardless of gas pressure variations in a system. Because the variation in dispensed ball counts is minimized, routine process verification operations may be obviated in some deployments, e.g., high-volume WLP environments. As ball wastage is also minimized in the examples herein, overall manufacturing quality, cost and productivity of a packaging plant may be advantageously improved. Further, while such examples and variations thereof may also be expected to reduce manufacturing defects that could otherwise reduce yields, reliability or electrical contact performance, no particular result is a requirement of the present disclosure unless explicitly recited in a particular claim.

Figure 2A:
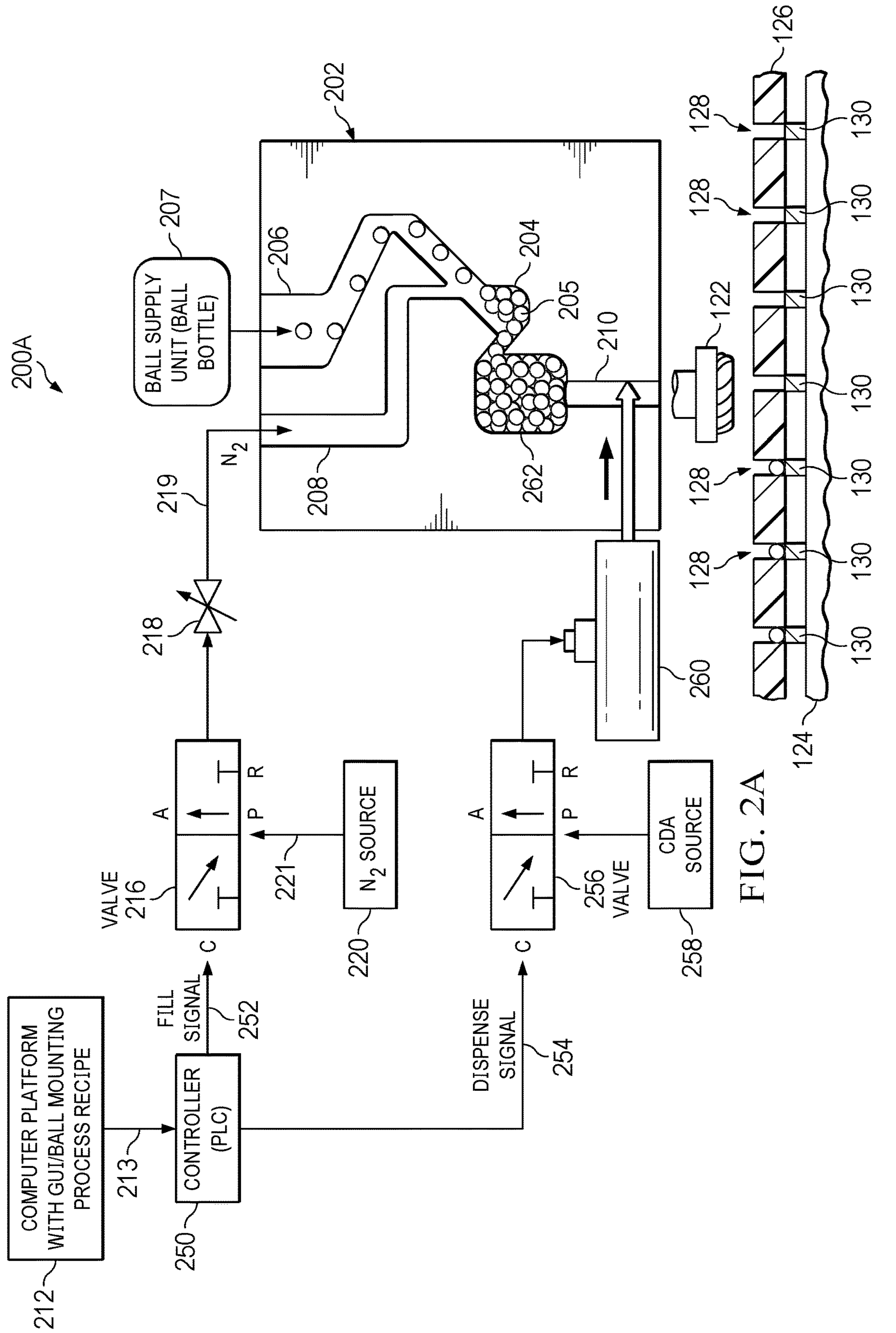
FIG. 2A depicts a ball mounting apparatus according to an example of the present disclosure where a ball dispenser mechanism is configured to dispense solder balls based on a fixed quantity filled in a buffer tank.

FIG. 2A depicts a ball mounting apparatus 200A according to an example of the present disclosure where a ball dispenser mechanism is configured to dispense solder balls based on a substantially fixed quantity filled in a buffer tank prior to release. As depicted, a dual action ball dispenser mechanism 202 may be provided as part the ball mounting apparatus 200A where a ball supply unit 207 may be deployed for supplying solder balls under gravity as set forth above with respect to the example of FIG. 1. A ball supply conduit, channel or path 206 may be disposed between the ball supply unit 207 and a ball storage unit 204 operable as a "pre-fill" store space having a volume, where the ball supply path 206 may be suitably dimensioned and shaped to allow the passage of solder balls under gravity into the pre-fill ball storage unit 204 that is configured for storing until expelled by a pressure-actuated action facilitated via a gas supply conduit, path or channel 208. In examples herein, the ball storage unit 204 may be configured to operate as a first volume or an intermediate solder ball storage volume with respect to another volume operable as a ball buffer space that may be filled in one or more solder ball transfer events prior to dispensing as will be set forth below. Similar to the example of FIG. 1, an inert gas supply unit 220 (e.g., $N_2$ source) may be provided for supplying bursts of pressurized gas under control of a first valve 216 (e.g., a solenoid valve or similar flow control device) disposed between gas lines 219 and 221, where the gas supply path 208 is coupled to the gas line 219 and a flow meter 218 may be provided for monitoring flow characteristics (e.g., flow rates, pressures, velocities, etc.). Whereas pressure-actuated actions in the example of FIG. 1 are directly operable to dispense the solder balls to a ball mounting brush, e.g., mounting brush 122, a pressure-actuated action in the example of FIG. 2A is operable responsive to a fill signal 252 generated by a controller 250 to expel the balls contained in the pre-fill ball storage unit 204 into a ball buffer tank or unit 262 having a pre-calibrated volume or capacity that is dimensioned and shaped to contain a fixed amount or quantity of balls for a given ball size and WLP application. For example, if a wafer has 500 IC dies and each IC die has 100 die pads that are routed to 100 corresponding area array contact structures via a redistribution layer arrangement, the ball buffer tank 262 used in the representative application may be sized such that it can be filled with a quantity of 50,000 balls (or substantially close thereto, e.g., within a given range such as ±2% or ±1000 balls in each dispense action) of the applicable size. Continuing with this example, for a given ball size/shape, a unit ball volume (UBV) may be determined and a buffer tank having a fill volume of (50,000 times UBV) may be configured for the WLP application. In similar manner, the volume of a pre-fill ball storage unit operable as an intermediate volume, e.g., ball storage unit 204, may also be designed and calibrated for a particular ball size in some example arrangements such that the storage unit 204 contains a fixed quantity of balls before being expelled in a pressure-actuated fill action (e.g., as a solder ball transfer event). Accordingly, the pressure-actuated actions effectuated in the example of FIG. 2A are operable to fill a pre-calibrated buffer tank having a fixed capacity, e.g., buffer tank 262, also referred to as a second volume or a buffer volume, rather than directly dispense the balls to a ball mounting brush for placement onto the area array contact structures formed on a wafer.

The example ball mounting apparatus 200A of FIG. 2A also includes a separate actuation mechanism for facilitating the release of the substantially fixed quantity of solder balls 205 contained in the ball buffer unit 262, where a second valve 256 is operable responsive to a control signal 254, referred to as a dispense control signal, release control signal, or in terms of similar import, that may be generated by the controller 250, for opening or closing a ball dispense conduit, channel, or path 210 connected to or otherwise associated with the ball buffer tank 262. In an example arrangement, valve 256 may comprise a solenoid valve or similar flow control device operable to allow the passage of pressurized clean dry air (CDA) from a CDA source 258 for actuating a mechanical needle valve including a plunger, rod, or piston or a similar component, which may be generally referred to as a gate valve or outlet valve, e.g., as illustrated by a representative mechanical arrangement 260. Responsive to a CDA stream, valve arrangement 260 is operable to open or close the passageway of the ball dispense path 210 to release or dispense the solder balls 205 from the buffer tank 262. Accordingly, when the dispense/release signal 254 is generated after filling the buffer tank 262 with a substantially fixed quantity of solder balls, e.g., balls 205, expelled from the pre-fill ball storage unit 204, which may be effectuated by one or more pressure-actuated fill actions in response to corresponding number of fill signals 252, the ball dispense path 210 may be actuated to open, thereby causing the buffer tank 262 to release the solder balls 205 to one or more ball mounting brush(es), e.g., mounting brush 122. As noted previously, the mounting brush(es) 122 may be configured to place the received balls onto respective area array structures 130 of an IC die forming a portion of wafer 124 via stencil 126 having corresponding apertures 128.

A computer platform 212 may be provided as part of the ball mounting apparatus 200A similar to the arrangement of FIG. 1, where suitable hardware and software, including one or more processors, GUIs, keyboards, pointing devices, application programs, ball mounting process recipes, etc., may be provided for controlling the overall operation of the ball mounting apparatus 200A. In some examples, various pieces of information relating to ball sizes, wafer sizes, number of IC dies and die pads, pre-fill storage space volumes, buffer volumes, etc., may be provided as part of ball mounting process recipes configured for different applications. In some examples, controller 250 may comprise a digital programmable logic controller (PLC) that may be a separate component coupled to the computer platform 212 and programed to receive one or more control signals 213 from the computer platform 212 in accordance with a ball mounting process recipe. Depending on the ball size and particular WLP application, the number of times a pre-fill ball storage unit, e.g., storage unit 204 of the dual action dispenser 202, needs to be emptied by a corresponding number of pressure-actuated fill actions may be determined for different deployment scenarios, which may be provided to the controller 250 as control signals 213. In response, the controller 250 may generate a suitable number of fill signals 252 configured to open the valve 216 for effectuating a corresponding number of pressure-actuated fill actions for expelling the solder balls from the pre-fill ball storage unit 204 that receives gravity-fed solder balls from the ball supply unit 207 as set forth previously. Thereafter, a single dispense/release control signal 254 may be generated in an example arrangement to actuate the CDA valve 256 for activating the outlet valve 260 in order to open the ball dispense path 210. After releasing the solder balls from the buffer tank 262, the outlet valve 260 may be actuated responsive to a subsequent control signal 254 to cause the closing of the ball dispense path 210.

Although the digital controller 250 and the computer platform 212 are depicted as separate components in FIG. 2A, they may be integrated in some variations, with separate fill signals 252 and dispense/release signals 254 provided in a given sequence depending on the particular deployment scenario.

Figure 2B:
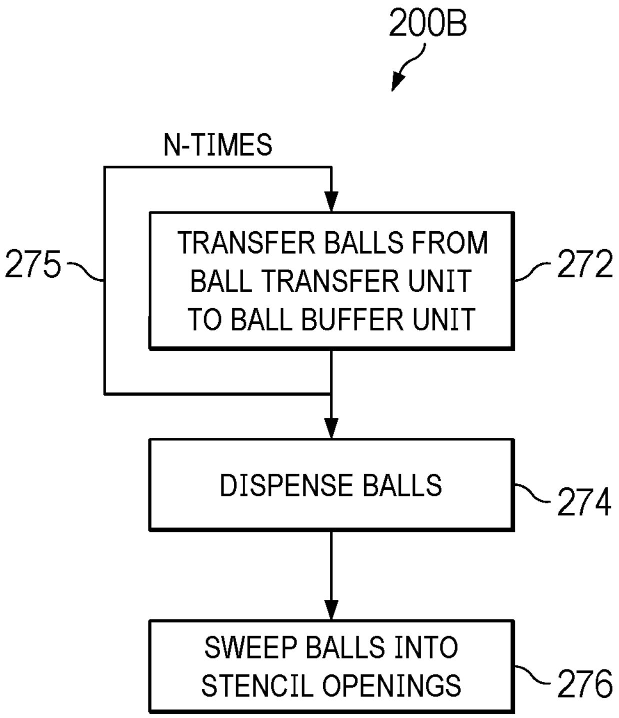
FIG. 2B depicts a flowchart of a ball mounting method using the apparatus of FIG. 2A in the manufacture of an IC device according to some examples.

FIG. 2B depicts a flowchart of a method 200B according to some examples of the present disclosure for solder ball attachment and IC manufacture. At block 272, solder balls from a ball transfer unit, e.g., a pre-fill storage unit 204 of the apparatus 200A, may be transferred to a ball buffer unit, e.g., buffer tank 262 of the apparatus 200B, in one or more fill actions or solder ball transfer events. In an example, the number of fill actions, N, may be determined for a given WLP application as a ratio between the buffer volume and the pre-fill storage unit volume, thereby requiring a corresponding number of solder ball transfer events to be performed in a repeated manner, e.g., as illustrated by loop 275. Thereafter, the solder balls may be dispensed or released responsive to a dispense action (block 274). At block 276, the solder balls may be distributed or otherwise spread via a sweep action into stencil openings of a perforated stencil overlying a wafer as set forth above in the example of FIG. 2A. In some additional and/or alternative variations, where a buffer volume is configured to contain only a fraction (e.g., a fourth, a half, etc.) of the total number of balls required for a wafer, multiple dispense and sweep actions may be effectuated in order to complete the ball attach process for the wafer. Further, the number of transfer events from a ball storage volume (e.g., pre-fill storage unit 204 of the apparatus 200A) to a ball buffer volume (e.g., buffer tank 262) may exceed the minimum number of transfer events (e.g., N) without penalty in some additional and/or alternative variations. In one arrangement, for example, additional transfer events after the ball buffer volume 262 is full do not result in additional balls being received by the ball buffer volume 262, thereby providing a fail-safe filling operation to ensure the ball buffer volume 262 contains the desired ball volume before dispensing the balls without requiring additional control.

In some examples, a solder ball transfer device for purposes of IC device manufacture may therefore be implemented as a dual action ball dispenser mechanism as set forth above that may include, among others, a path or channel 206 from a solder ball source 207 to an intermediate solder ball storage volume 204, a gas flow path or channel 208 directly connected to the intermediate solder ball storage volume 204, and a solder ball buffer volume 262 connected between the intermediate solder ball storage volume 204 and an outlet valve 260, where the solder ball buffer volume 262 may be configured to receive solder balls from the intermediate solder ball storage volume 204 in response to one or more solder ball transfer events that include directing a gas flow to the intermediate solder ball storage volume 204.

Figure 3A:
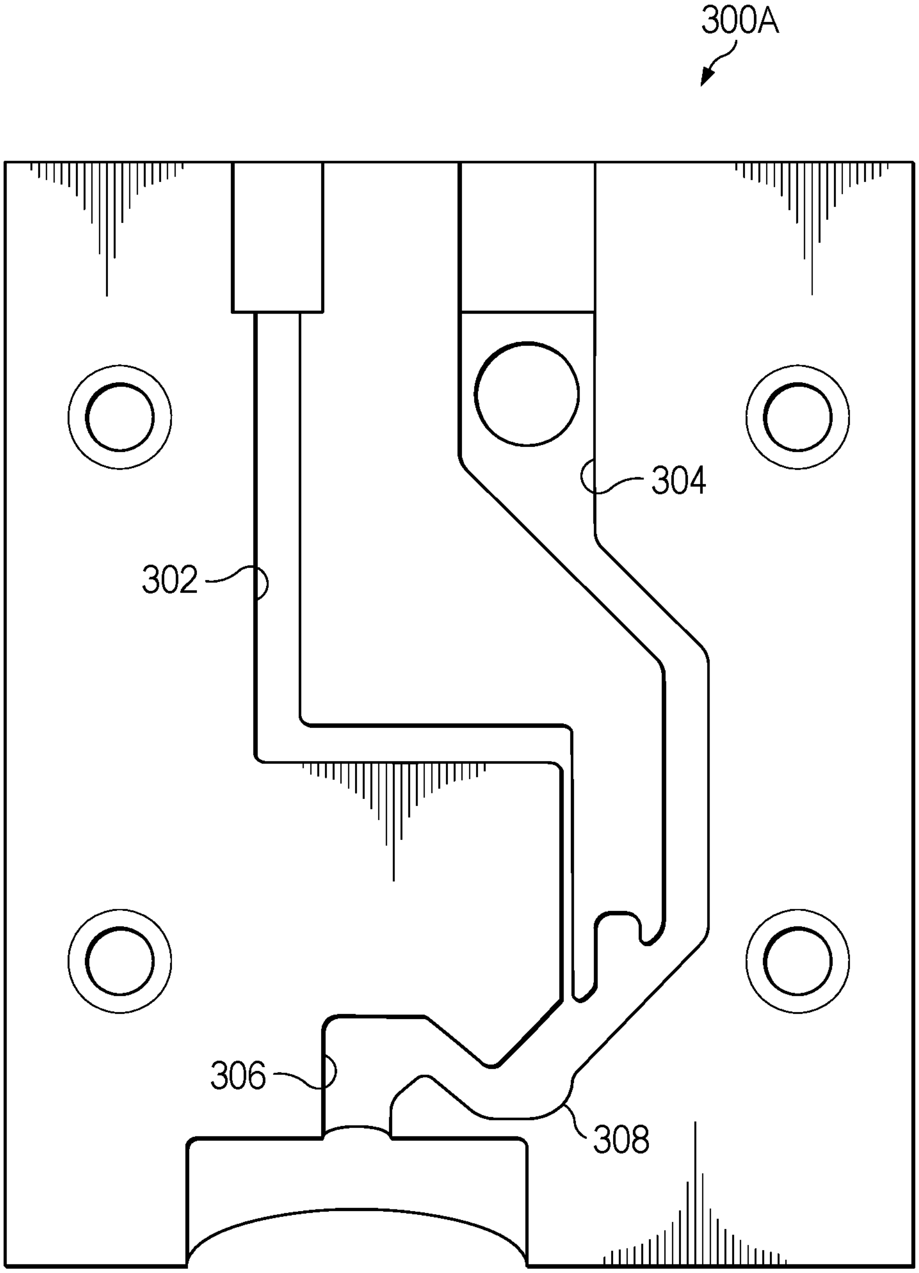
FIG. 3A depicts a baseline ball dispenser.
Figure 3B:
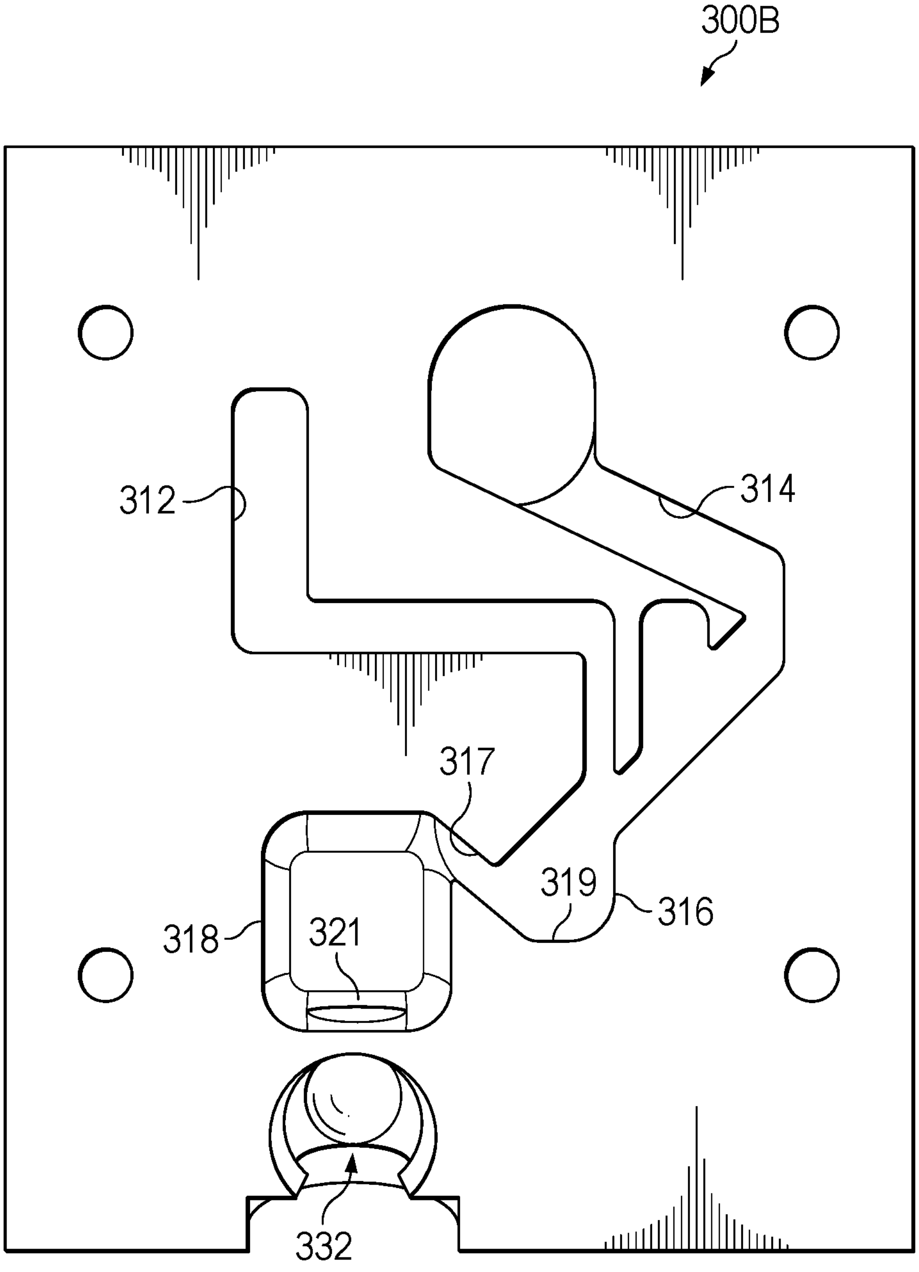
FIGS. 3B and 3C depict a ball dispenser according to an example of the present disclosure.
Figure 3C:
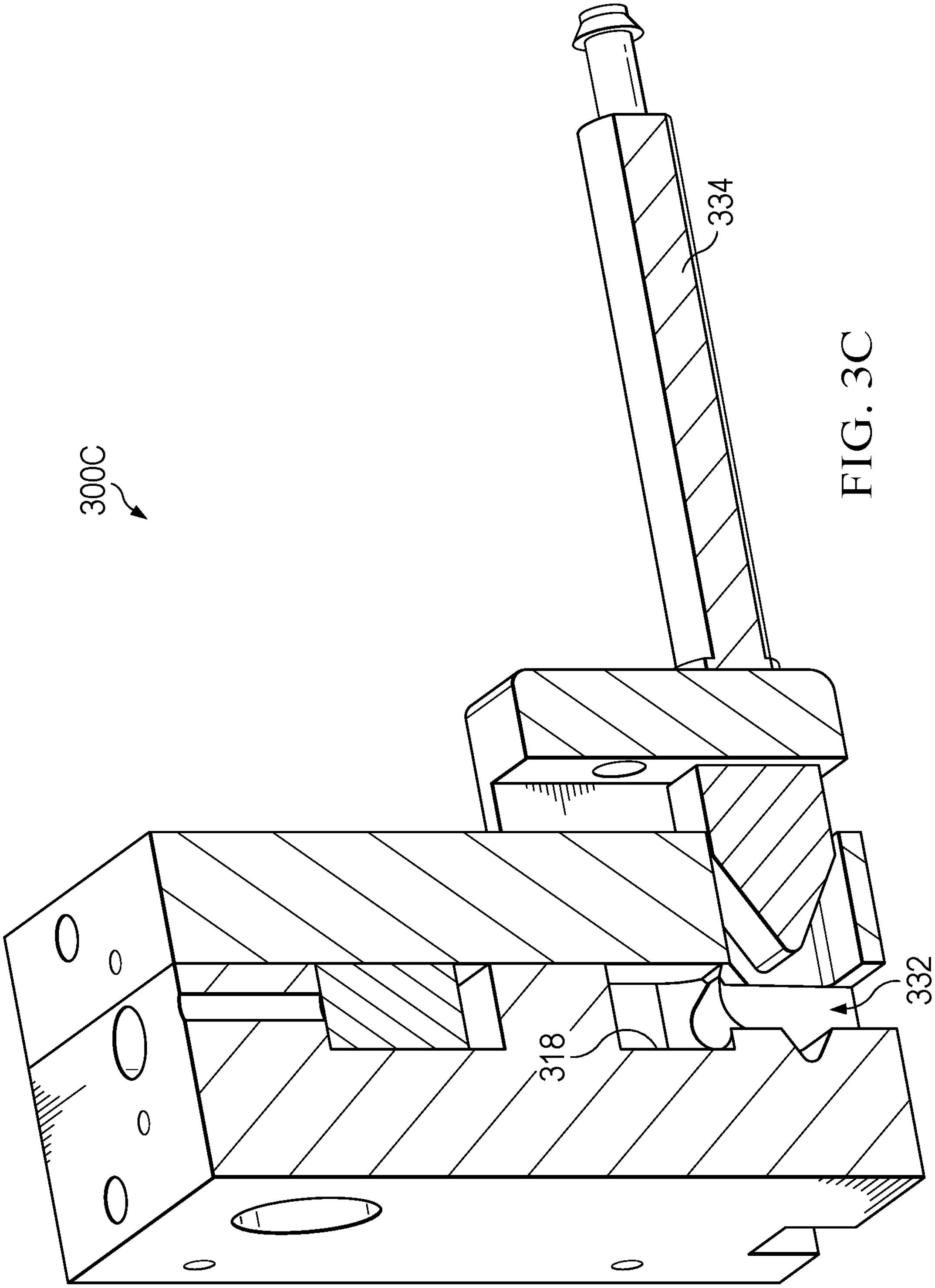

Turning to FIGS. 3A-3C, reference number 300A in FIG. 3A refers to a baseline ball dispenser housing or block that includes a gas supply path 302, a ball supply path 304 and a ball dispense path 306 providing suitable passageways relative to a ball store space 308 operable to dispense solder balls in response to pressure-actuated actions as described above in the example of FIG. 1. FIG. 3B depicts a dual action ball dispenser housing or block 300B according to various examples of the disclosure, where a pre-fill ball storage unit 316 is connected to a gas supply path 312, a ball supply path 314 and a ball buffer tank 318 for effectuating fill and release actions as set forth above in the examples of FIGS. 2A and 2B. FIG. 3C depicts a 3D rendering that illustrates a more complete view of a dual action ball dispenser housing or block 300C according to various examples of the disclosure including a mechanical gate valve mechanism 334 to control a ball dispense path 332 associated with ball buffer tank 318 that may be operable to be filled with solder balls and actuated to release the solder balls subsequently in response to separate sets of control signals as set forth above in the example of FIG. 2A. Depending on implementation, different combinations of ball buffer tanks and pre-fill ball storage units, e.g., having different volume ratios, may be provided for various dual action ball dispensers that may be deployed in particular application scenarios. For example, in one arrangement, a ball buffer unit may have a volume at least two times greater than the volume of a ball storage unit, which is operable as a ball transfer unit with respect to the ball buffer unit as previously noted. Further, example dual action dispenser housings/blocks 300B/300C may have appropriate sizes, dimensions and form factors, and may be made of suitable hard and machinable materials such as plastic, ceramics, metals, and the like, using known or heretofore unknown manufacturing techniques, e.g., subtractive manufacturing processes such as milling, injection molding, machining, etc., as well as additive manufacturing processes such as 3D printing.

Still further, an example dual action dispenser may comprise a housing, e.g., housing 300B (FIG. 3B), that may be constructed as a unitary or single material block, or as a system containing two or more rigidly connected pieces, where appropriate passageways and volumes may be provided in specific spatial orientations. For example, the ball buffer tank unit 318 and the ball transfer unit 316 may be operable as two volumes formed within a single material block that are connected via a channel 317 sloping upward from the ball transfer unit 316 to the ball buffer unit 318. Similarly, gas supply and ball supply paths 312, 314 as well as the ball dispense path 332 may be formed as respective channels formed in the housing block, where the ball buffer unit 318 may be provided with appropriate orifices or apertures for allowing the passage of solder balls into (e.g., as an inlet) or out of the volume/space (e.g., as an outlet) contained in the ball buffer unit 318. Also, the ball transfer unit 316 may have a bottom 319 that is higher than a bottom 321 of the ball buffer unit 318 to which the ball dispense path 332 may be connected. Other spatial orientations with respect to the ball transfer unit 316 and ball buffer unit 318 as well as respective channels may be provided within a dispenser housing block in additional and/or alternative examples.

Figure 4:
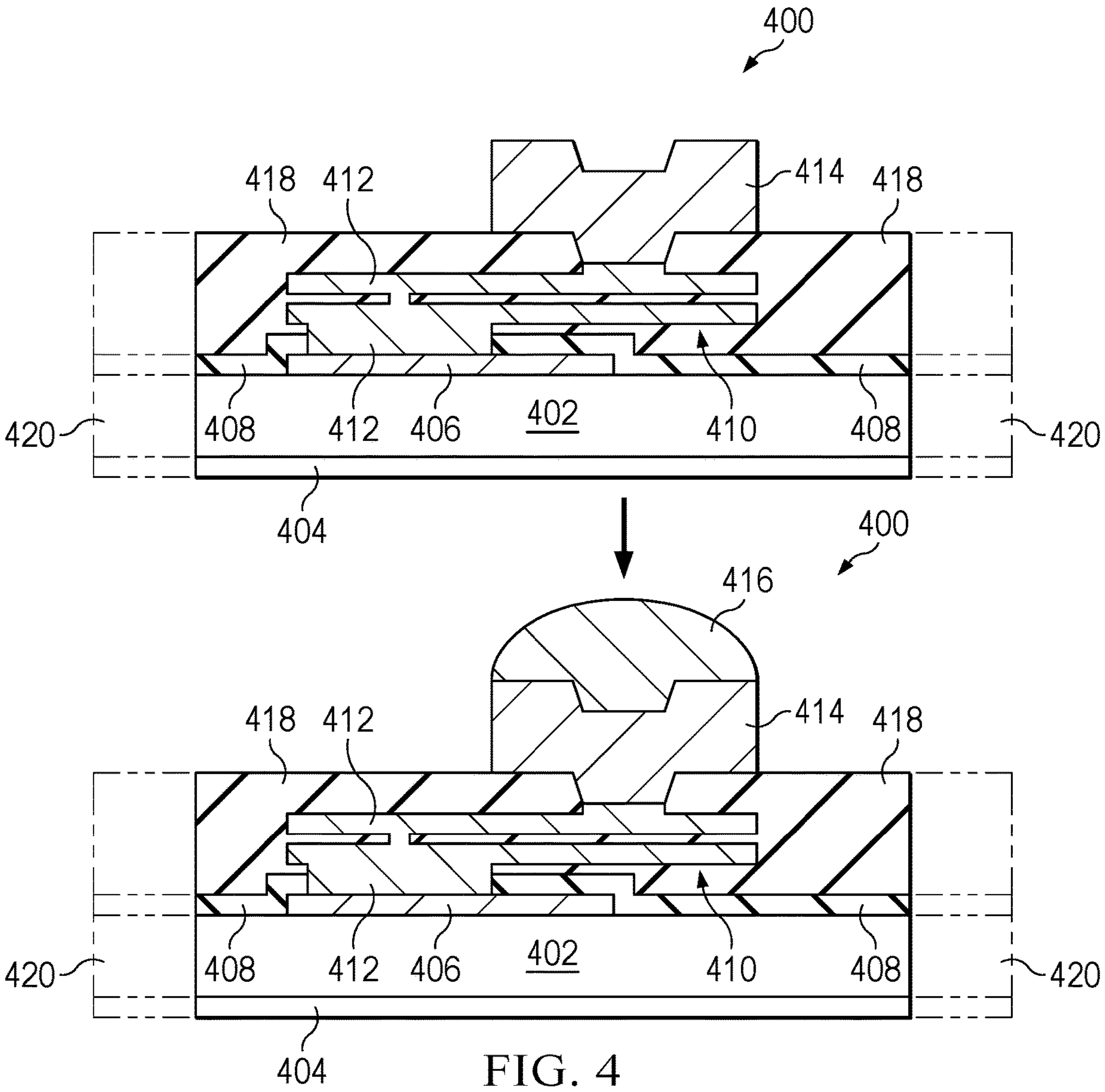
FIG. 4 depicts a portion of a wafer including an IC die before and after attaching a solder ball to an area array contact structure using a ball mounting apparatus of the present disclosure.
Figure 8A:
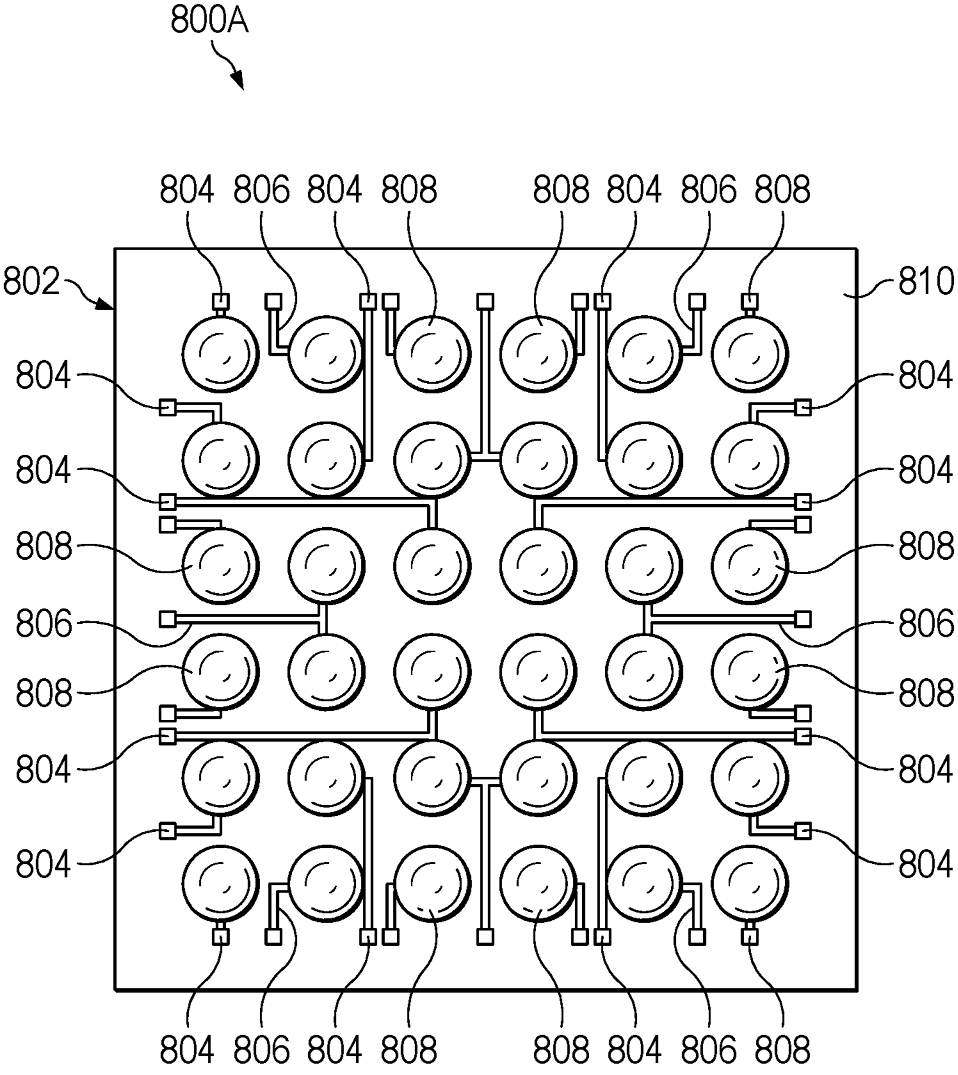
FIGS. 8A and 8B depict fan-in and fan-out WLP configurations according to some examples.
Figure 8B:
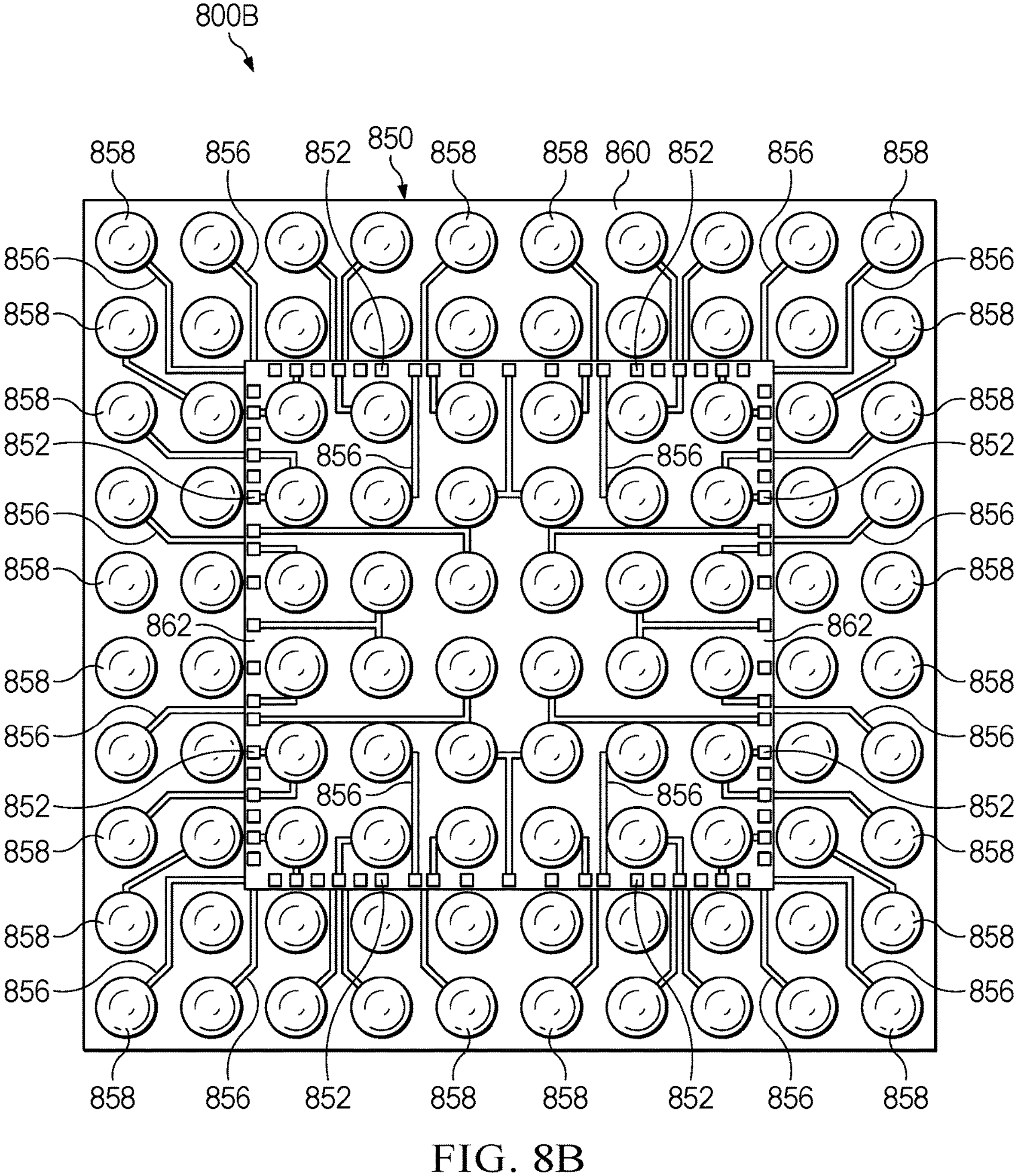

FIG. 4 depicts cross-sectional views of a portion of a wafer 400 including an IC die or chip 404, or a portion thereof, before and after attaching a solder ball to an area array contact structure using a ball mounting apparatus of the present disclosure. Depending on implementation, wafer portion 400 may be representative of a semiconductor wafer (for fan-in WLP configuration) or a carrier wafer (for fan-out WLP configuration), as noted previously. Regardless of the WLP configuration, a plurality of IC dies may formed in a suitable substrate, each IC die 404 having a plurality of peripheral die pads, e.g., die pad 406, having suitable metallization (e.g., aluminum pads), which may be exposed by way of corresponding openings in a protective overcoat (PO) 408 formed over the IC die 404, where a substrate 402 of the IC die 404 is operable to support various electronic components, devices, and circuits (not specifically shown in this Figure). Depending on implementation, the substrate 402 may predominantly comprise suitably doped silicon in some examples, although other semiconductor materials such as, Ge, GaAs, SiC, GaN, other Group III-V materials, etc., may be used in some implementations, where one or more epitaxial layers or single-crystal layers may be formed or provided in certain areas of the substrate 402 in some arrangements. A redistribution layer arrangement (RDL) 410 having one or more redistribution layers 412, e.g., based on a copper-on-anything (COA) redistribution layer arrangement, may be provided for routing the peripheral die pads 406 to a corresponding number of area array contact structures 414, operable as solder ball contacts, formed over or in openings of a patterned polyimide (PI) protective layer 418 encapsulating the IC die 404 and the RDL arrangement 410. In a fan-in WLP configuration, the area array contact structures 414 may be located or positioned within the boundary of the IC die 404. On the other hand, the area array contact structures 414 may be disposed within the boundary of the IC die 404 as well as across the boundary over the PI material overlying an area of the molding material 420 used in reconstituting the IC dies 404 for a fan-out WLP configuration. By way of illustration, FIGS. 8A and 8B depict top views of example fan-in and fan-out configurations 800A, 800B, respectively. In the fan-in configuration 800A, an IC die 802 has a plurality of peripheral die pads 804, also referred to as input/output (I/O) pads, that are connected to respective area array contact structures or bumps 808 that are located inside a boundary 810 of the IC die 802, where appropriate redistribution connections 806 may be provided as one or more topside interconnect layers encapsulated in a PI layer (not specifically shown). In the fan-out configuration 800B, an IC die 850 having a plurality of peripheral die pads 852 is reconstituted, after diced from the semiconductor wafer, in a molding material 860 of a carrier wafer (not specifically shown), where the die pads 852 are connected to corresponding area array contact structures or bumps 858 disposed within and across a boundary 862 of the IC die 850 via suitable redistribution connectors 856.

Returning to FIG. 4, example area array contact structures 414 may comprise an under-bump metal (UBM) forming a metallic pillar (e.g., copper pillar) in some arrangements. In other variations, the area array contact structures 414 may be formed without UBM pillars, where planar metallic contact pads (e.g., copper pads) or other low-profile contact areas may be provided as solder ball contacts. Regardless of whether UBM is utilized in the formation of area array contact structures 414, an example wafer 400 may be positioned in a ball mounting apparatus of the present disclosure, which may be aligned with respect to a suitably perforated stencil such that the area array contact structures 414 may be disposed directly beneath corresponding holes/apertures in the stencil for receiving a solder ball 416 of suitable size in a ball attach process, which may also be referred to as a "wafer bumping" process in some deployments.

Figure 5A:
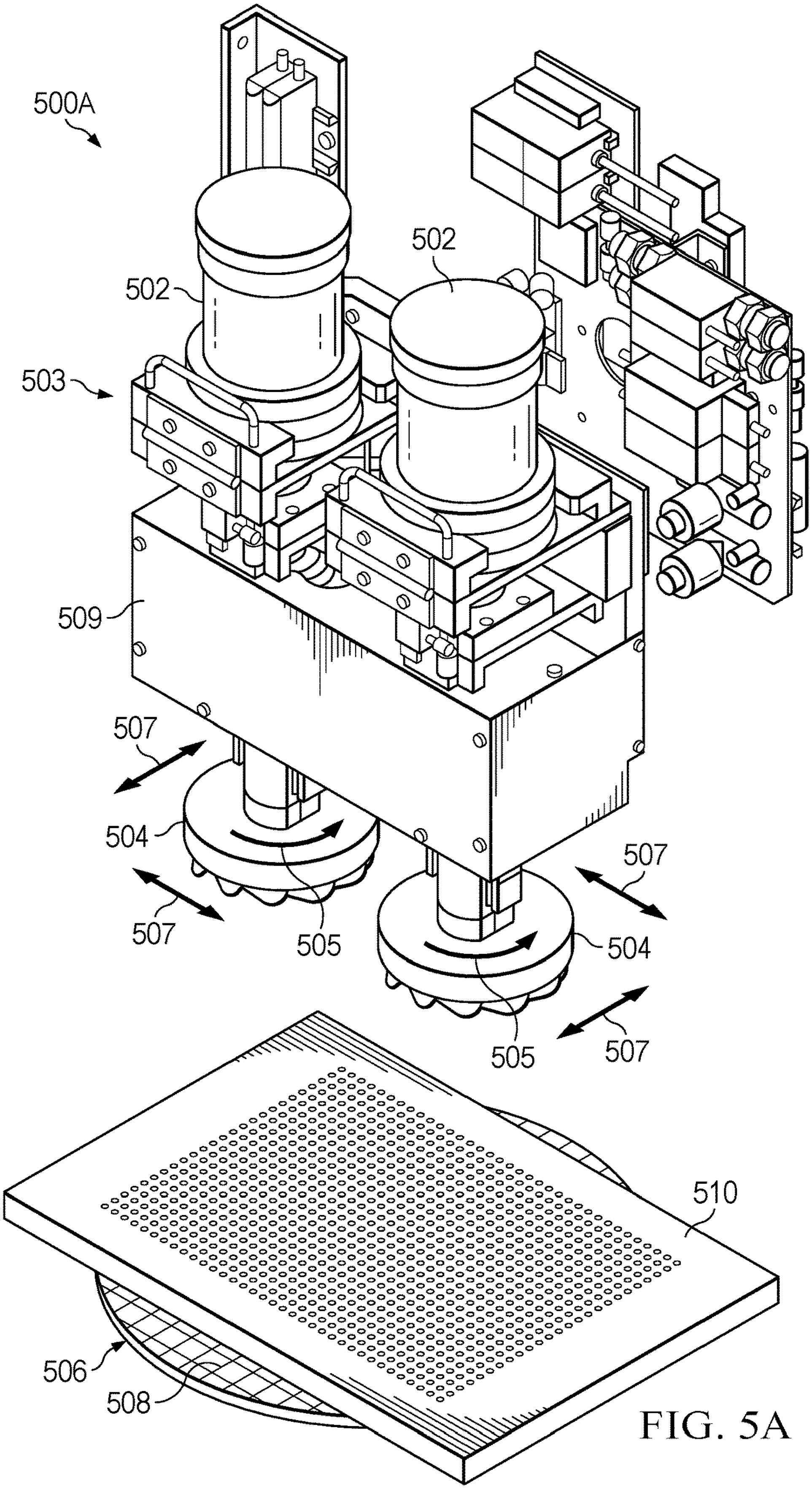
FIGS. 5A and 5B depict a 3D line drawing and a schematic diagram, respectively, of a ball mounting apparatus including a ball dispenser of the present disclosure according to some examples.
Figure 5B:
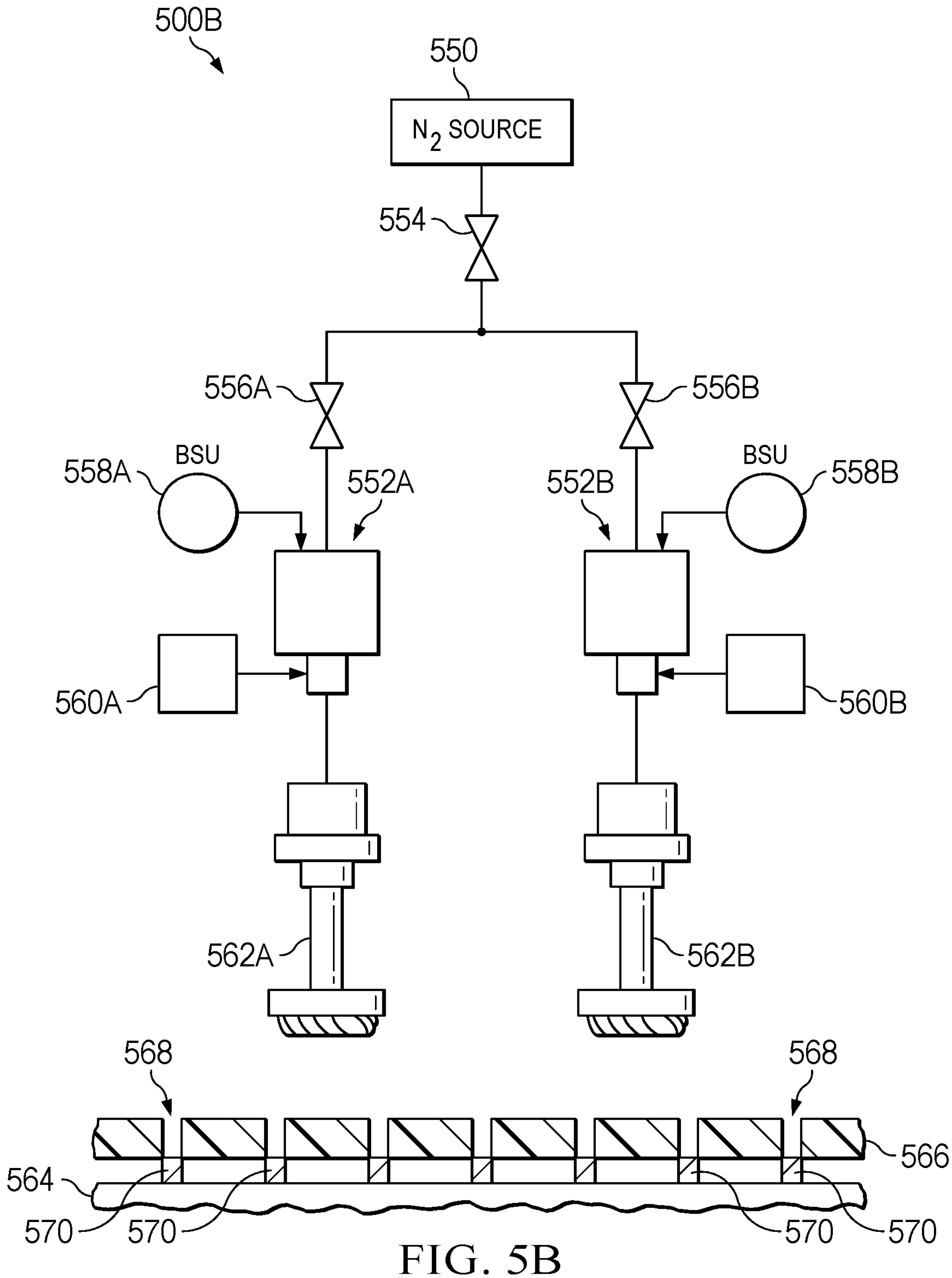

FIGS. 5A and 5B depict a 3D line drawing and a schematic diagram, respectively, of a ball mounting apparatus including a ball dispenser of the present disclosure according to some examples. Example ball mounting apparatus 500A shown in FIG. 5A may include a platform, frame or a structural member 503 configured to support two ball supply units 502 connected to respective ball dispensers (not specifically shown), which may be housed in a chamber, compartment or other structural component 509 configured to cooperate with the ball supply units 502. As set forth in detail above, an example ball dispenser is operable as a solder ball transfer device based on dual actions of fill and release stages that may be configured to release solder balls to respective ball mounting brushes 504 having the capability for rotational movement 505 around respective rotational axes as well as for lateral movement 507 along orthogonal directions on a horizontal plane parallel to a perforated stencil 510. Whereas having multiple ball mounting brushes 504 may be advantageous in increasing the throughput, it is not a necessary requirement. A semiconductor wafer or a reconstituted carrier wafer 506 including a plurality of IC dies 508 may be aligned to the perforated stencil 510 having suitably sized holes/apertures (not shown to scale), where the stencil 510 may have the same thickness as the size of the solder balls to be dispensed in an example arrangement. Further, the holes/apertures of stencil 510 may have a size slightly larger than the ball/UBM size, e.g., about 10% or so larger in some examples, to allow unobstructed passage of the balls while minimizing the risk of slipping through.

In the schematic diagram 500B of FIG. 5B, which roughly corresponds to the ball mounting apparatus 500A of FIG. 5A, a gas source 550 is operable to supply inert gas under control of a valve 554 to two dual action ball dispensers 552A, 552B via respective flow meters 556A, 556B, where each ball dispenser 552A/B is operable to receive solder balls from respective ball supply units (BSUs) 558A/B by way of a gravity feed mechanism as described previously. Respective CDA cylinder and associated valve control systems, generally shown with reference numbers 560A, 560B, are operable to control the release of solder balls from the buffer tanks (not specifically shown) of ball dispensers 552A, 552B. Ball mounting brushes 562A, 562B connected to respective ball dispensers 552A, 552B are operable to place the solder balls onto area array contact structures 570 formed on a wafer 564 aligned to perforations 568 of a stencil 566 as described above.

Figure 6B:
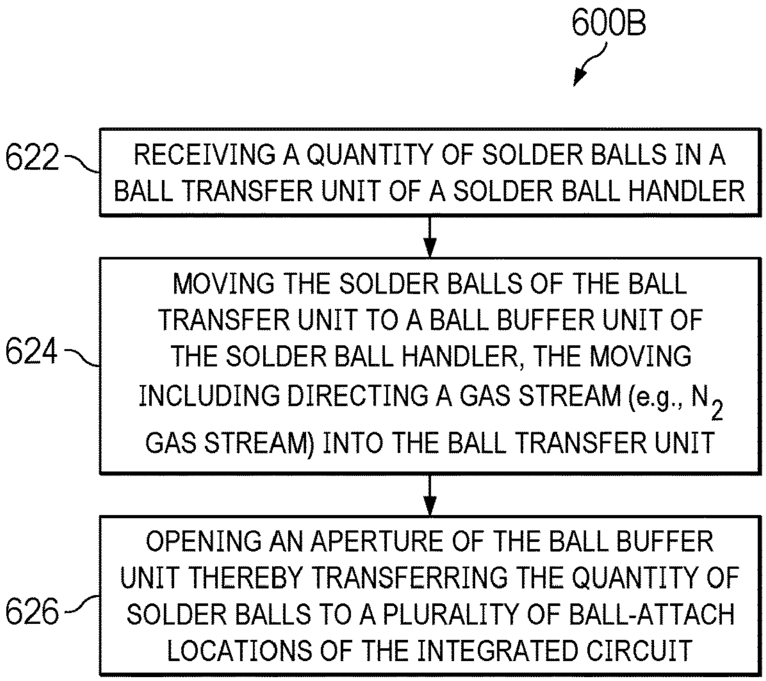
Figure 6C:
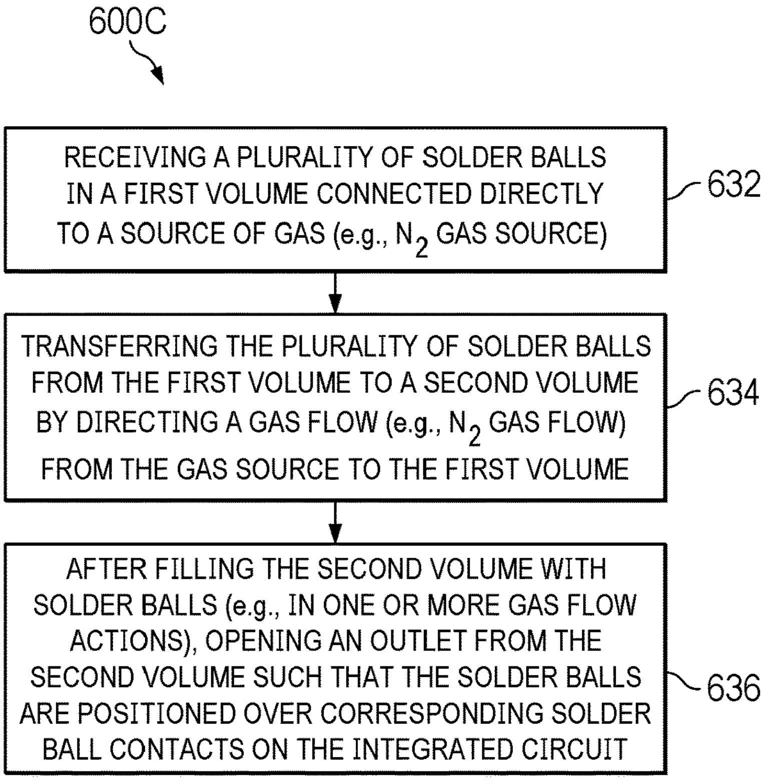

FIGS. 6A-6C are flowcharts according to some example methods of the present disclosure. FIG. 6A depicts an example ball mounting method 600A using a dual action ball dispensing mechanism according to an implementation. Method 600 may comprise filling a ball buffer unit with a substantially fixed quantity of solder balls received from a ball storage unit fed by a ball supply unit, where the ball storage unit is operable to store solder balls until expelled by a pressure-actuated action and the ball buffer unit may receive the substantially fixed quantity of solder balls in one or more pressure-actuated actions as set forth at block 602. As described in detail above, a substantially fixed quantity of solder balls may depend on the WLP application, ball size, the number of solder balls required for a wafer, etc., which may be provided by way of a process recipe for defining a stable quantity of solder balls to be dispensed depending on the pre-calibrated buffer volumes and pre-fill storage volumes, where the dispensed ball quantity for each wafer remain may within certain process control limits or specifications over a number of wafers. The example method 600A may include, responsive to a dispense signal generated by a controller, causing the ball buffer unit to release the substantially fixed quantity of solder balls to a ball mounting brush configured to place the substantially fixed quantity of solder balls onto area array contact structures formed on one or more semiconductor dies of a wafer for wafer-level packaging (block 604).

Method 600B of FIG. 6B relates to forming an IC according to an example, which may comprise, among others, receiving a quantity of solder balls in a ball transfer unit of a solder ball handler, e.g., configured to operate based on a dual action ball dispenser mechanism described herein (block 622). At block 624, the method may comprise moving the solder balls to a ball buffer unit of the solder ball handler, where the moving includes directing a gas stream into the ball transfer unit. At block 626, the method may comprise opening an aperture of the ball transfer unit, thereby transferring the quantity of solder balls to a plurality of ball-attach locations or solder ball contacts of the IC.

Method 600C of FIG. 6C relates to forming an IC according to an example, which may comprise, among others, receiving a plurality of solder balls in a first volume (e.g., a pre-fill ball storage volume) connected directly to a source of gas (bock 632). At block 634, the method may comprise transferring the plurality of solder balls from the first volume to a second volume (e.g., a ball buffer volume) by directing a gas flow from the gas source to the first volume. At block 636, the method may comprise, after filling the second volume with solder balls, opening an outlet from the second volume such that the plurality of solder balls are positioned over corresponding solder ball contacts on the IC.

Figure 7:
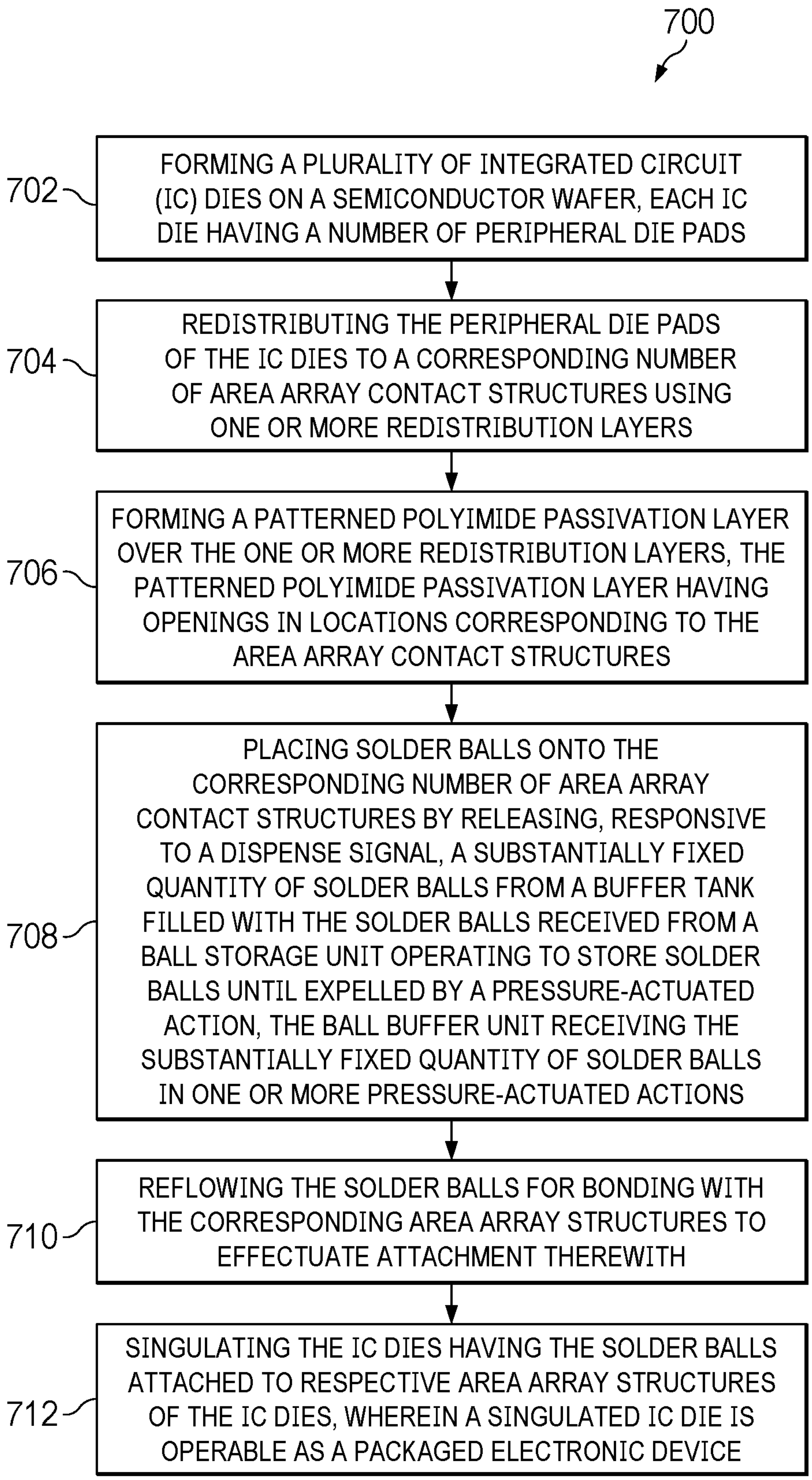
FIG. 7 is a flowchart of an IC fabrication method according to some examples of the present disclosure.

FIG. 7 is a flowchart of a method of IC fabrication/manufacture according to some examples of the present disclosure. In one arrangement, an example method 700 may comprise forming a plurality of ICs on a semiconductor wafer, where each IC has a number of peripheral die pads (block 702). At block 704, the die pads of the ICs may be redistributed into a corresponding number of area array contact structures using one or more redistribution layers. At block 706, a patterned polyimide passivation layer may be formed over the redistribution layers, the patterned polyimide passivation layer surrounding or otherwise having openings in locations corresponding to the area array contact structures. At block 708, solder balls may be placed onto the corresponding number of area array contact structures by releasing, responsive to a dispense signal, a substantially fixed quantity of solder balls from a buffer tank filled with the substantially fixed quantity of solder balls received from a ball storage unit operating to store solder balls until expelled by a pressure-actuated action, where the ball buffer unit is operable to receive the substantially fixed quantity of solder balls in one or more pressure-actuated actions. At block 710, the solder balls may undergo a reflow operation for forming a bond with the corresponding area array structures to effectuate attachment therewith. At block 712, the ICs having the solder balls attached to respective area array structures may be separated by dicing the wafer, where a singulated IC is operable as a packaged electronic device. A process similar to the foregoing method 700 may also be implemented for fabricating IC devices having a fan-out configuration provided in a reconstituted carrier wafer carrying KGDs as previously noted.

Figure 9A:
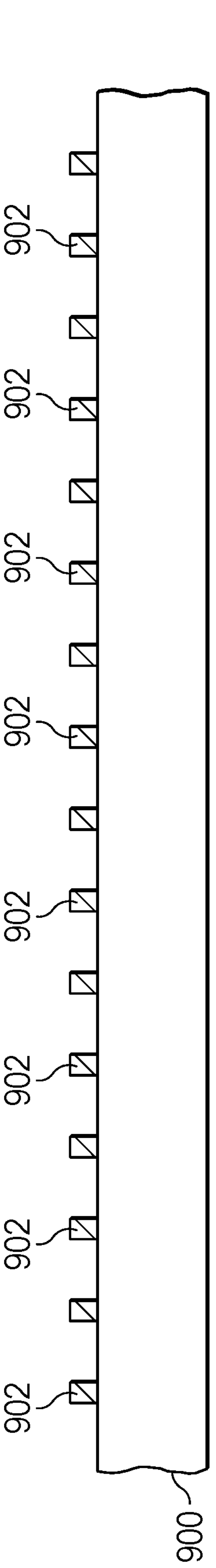
FIGS. 9A-9I depict views of an IC die progressing through various stages of a ball mounting process according to some examples of the present disclosure.
Figure 9B:
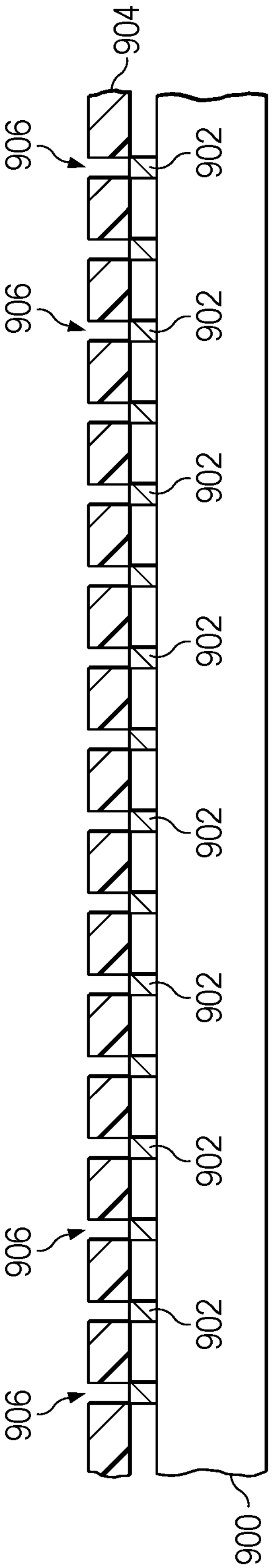
Figure 9C:
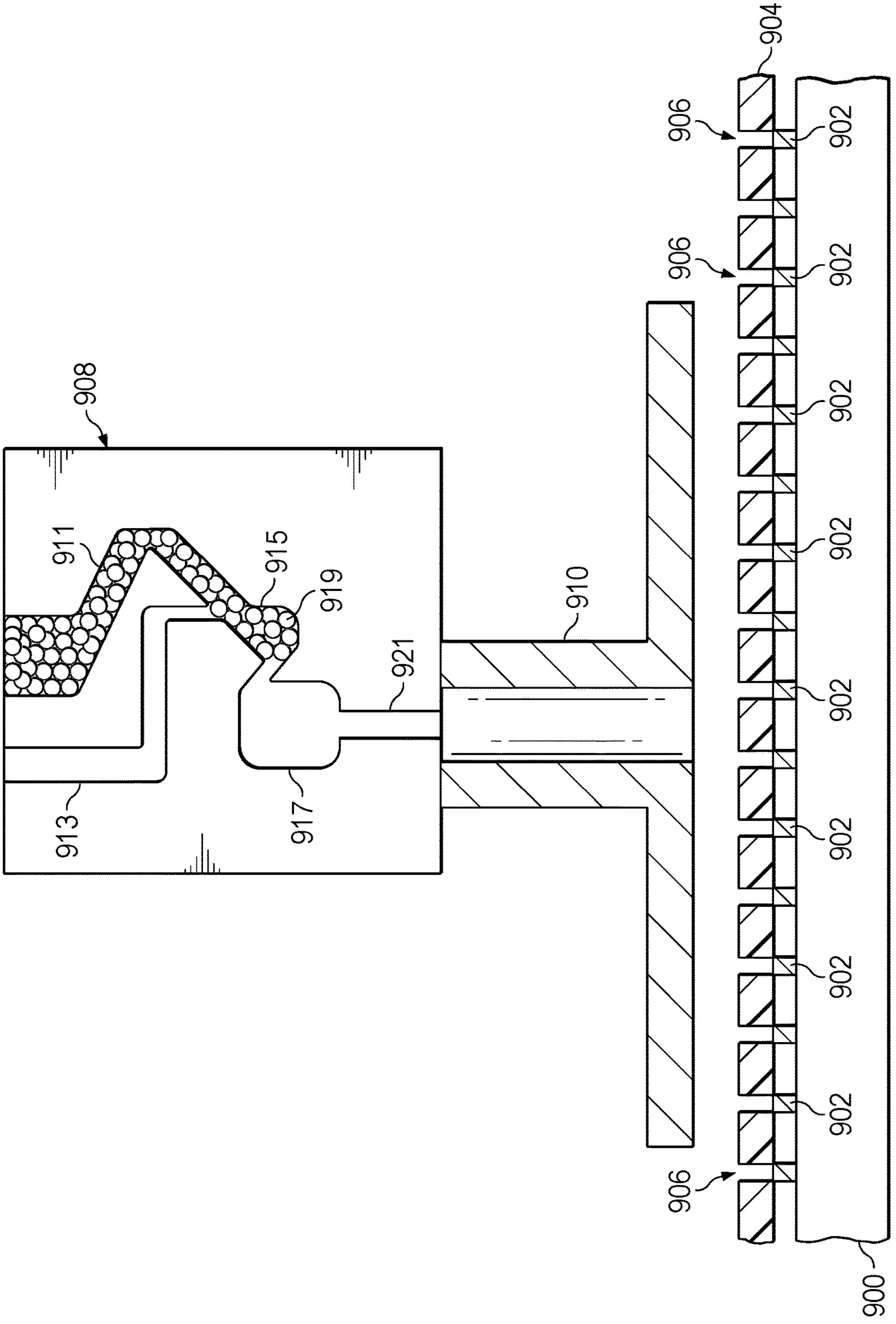

FIGS. 9A-9I depict views of an IC die progressing through various stages of a ball mounting process according to some examples of the present disclosure. FIG. 9A depicts an example IC die 900 having a plurality of area array contact structures 902 operable as solder ball contacts or posts, where the IC die 900 may form part of a wafer in a fan-in or fan-out WLP configuration as set forth with respect to the example of FIG. 4 described above. FIG. 9B depicts a stage where a perforated stencil 904 having apertures 906 is positioned in proximity to the IC die 900 so as to align the apertures 906 with respective area array contact structures 902 of the IC die 900. FIG. 9C depicts a stage where the aligned stencil-wafer arrangement is presented to a solder ball transfer device 908 of a ball mounting apparatus (e.g., apparatus 200B of FIG. 2B), where a ball supply path 911 is operable to supply solder balls 909 to a pre-fill ball storage volume 915 that is connected to a gas supply path 913. A ball mounting brush 910 is connected to the ball transfer device 908, where a ball buffer volume 917 may be filled with solder balls expelled from the pre-fill ball storage volume 915. As illustrated, the ball mounting brush 910 is disposed over the perforated stencil 904 in order to facilitate positioning of solder balls released from the ball buffer volume 917 via a ball dispense path 921 associated therewith.

Figure 9D:
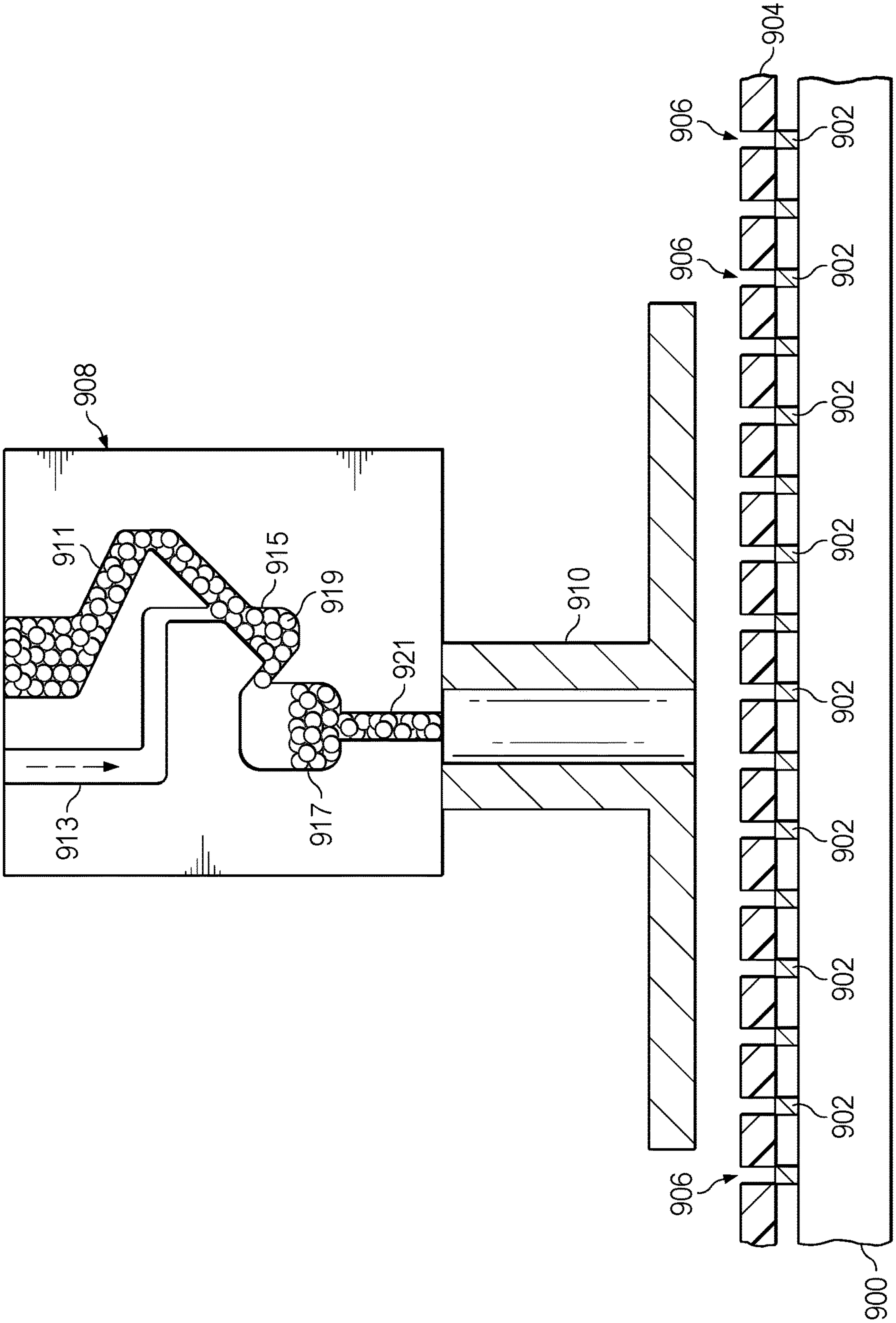
Figure 9E:
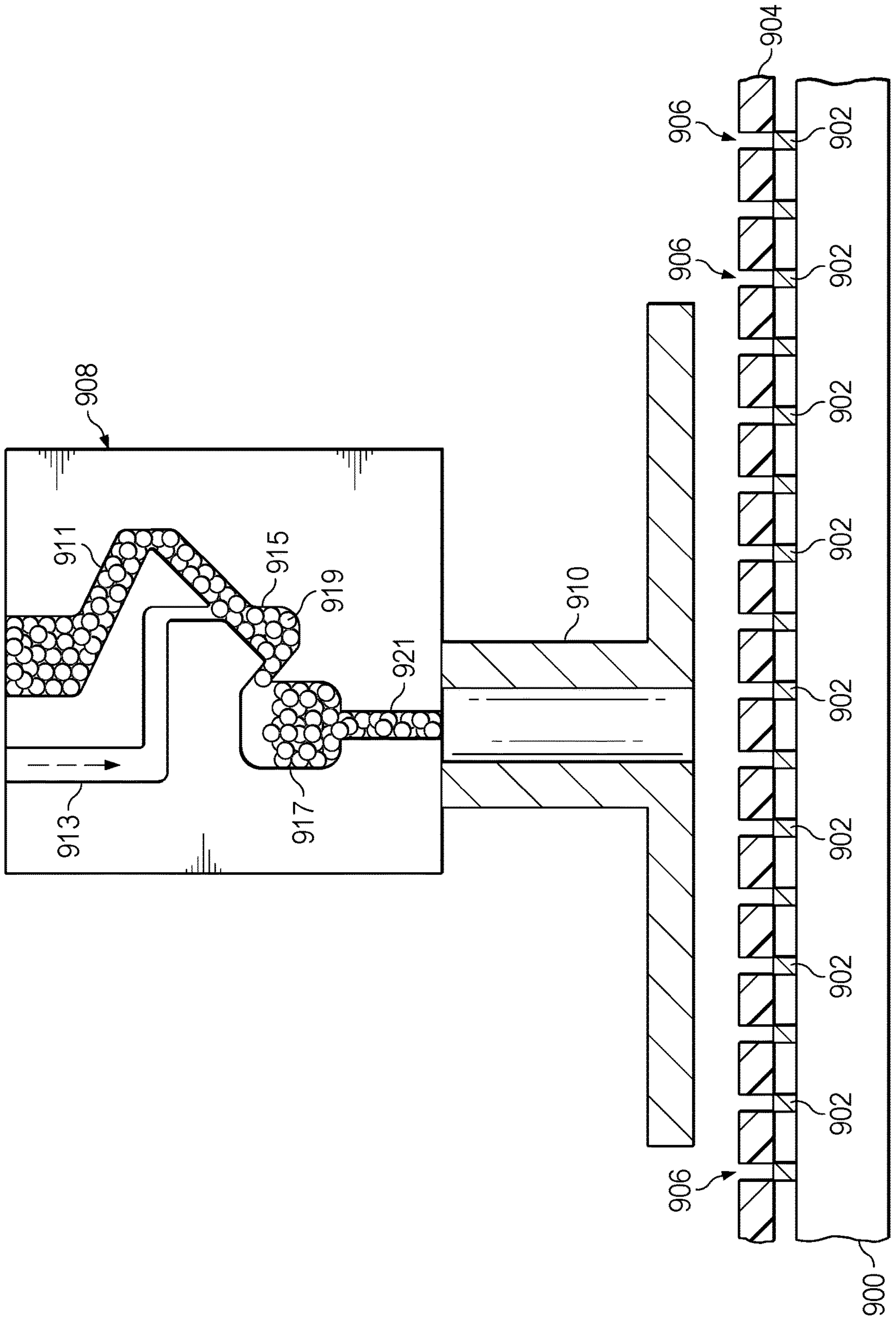
Figure 9F:
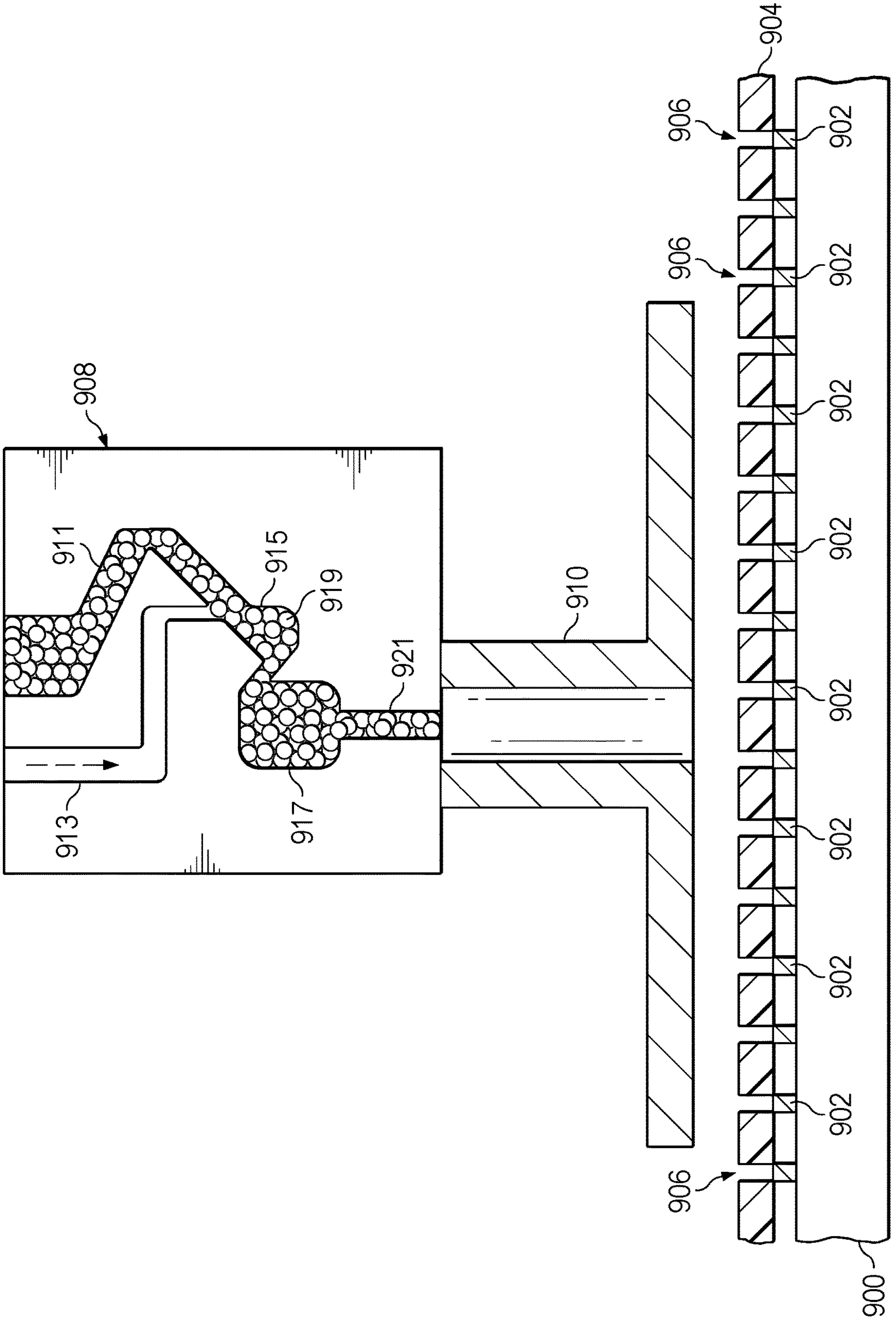
Figure 9G:
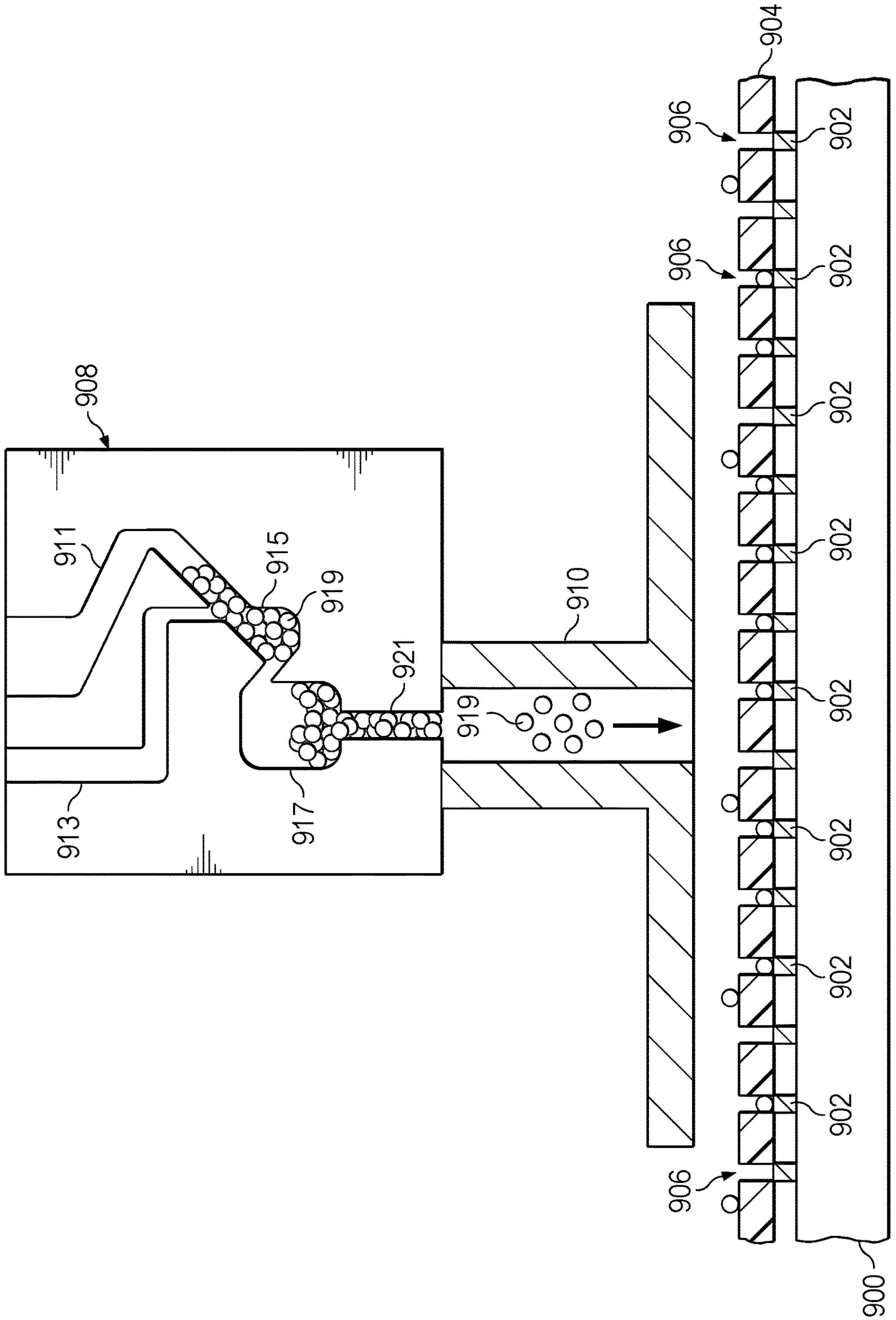
Figure 9H:
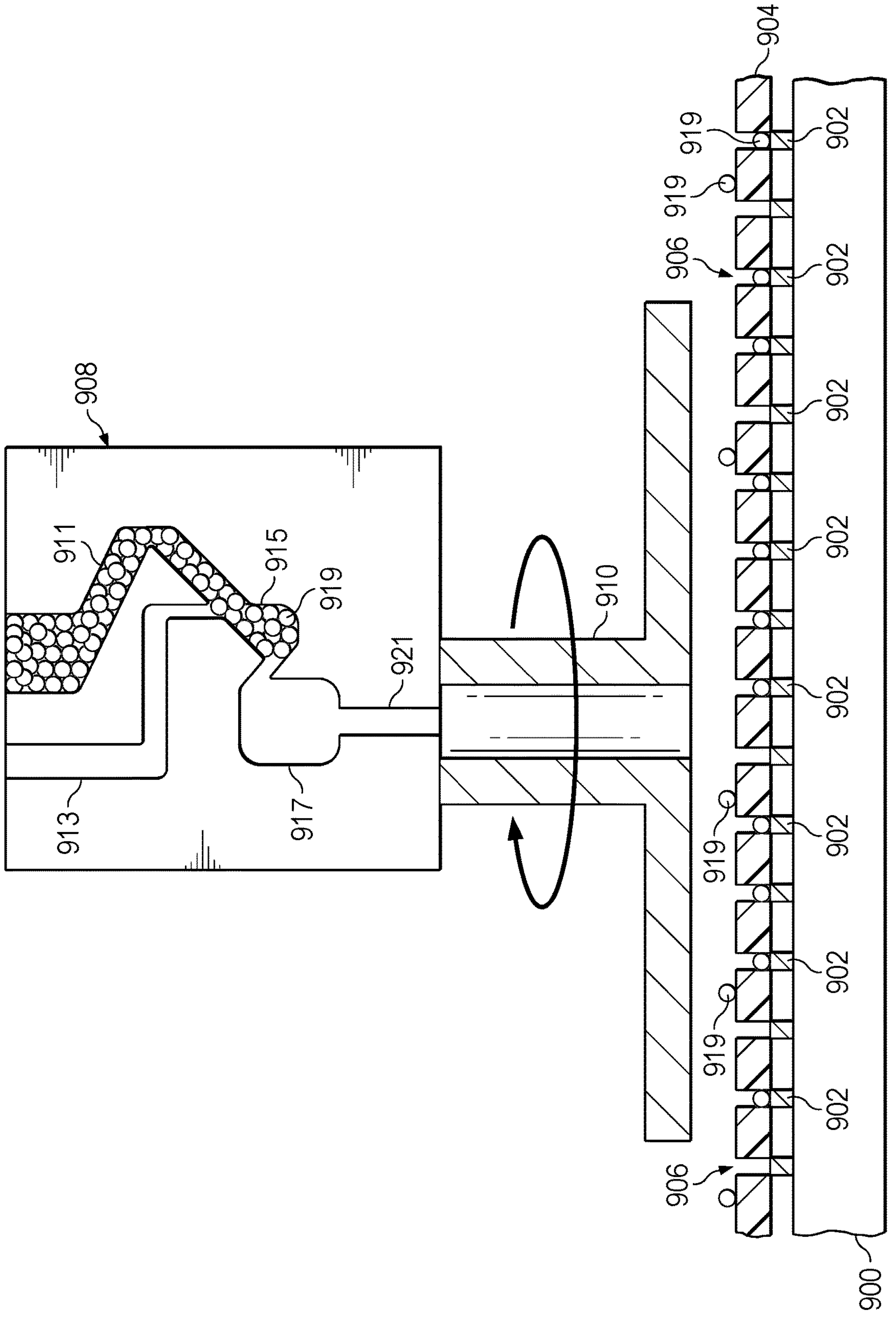
Figure 9I:
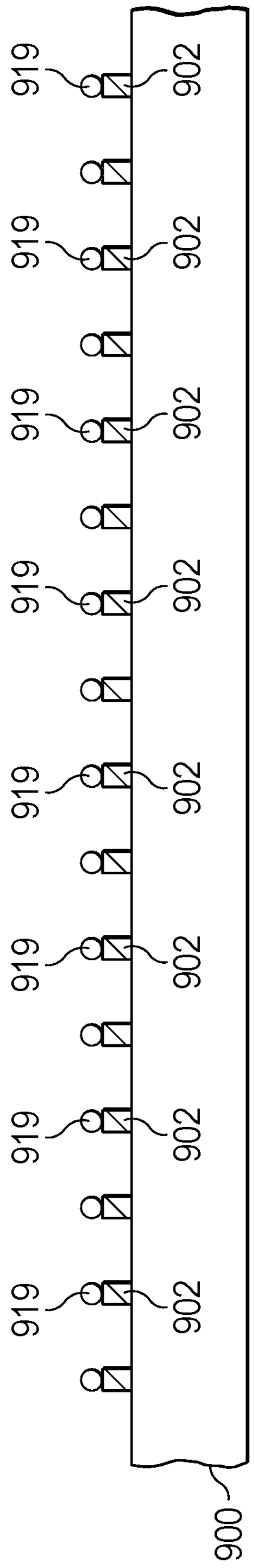

FIGS. 9D-9F illustrate the filling of the buffer volume 917 in successive stages (e.g., in three stages caused by three pressure-actuated fill actions effectuated via the gas supply path 913), resulting in a quantity of solder balls 919 (representing a substantially fixed quantity of solder balls as described hereinabove). FIGS. 9G and 9H illustrate releasing of the solder balls 919 and disseminating the solder balls 919 by way of suitable motion, e.g., rotational and/or lateral motion, vibrational motion, jitter motion, etc., whereby the solder balls 919 are passed through the apertures 906 of the stencil 904 and onto respective solder ball contacts 902 of the IC 900. FIG. 9I depicts a stage where the solder balls 919 are positioned in contact with the solder ball contacts 902 of the IC 900. As noted above, a reflow operation may be performed to effectuate bonding between the solder balls 919 and the solder ball contacts 902, whereupon the wafer including IC 900 may be removed from the ball mounting apparatus for testing, quality inspection, and dicing, etc., which may be performed in a suitable order depending on deployment. IC dies 900 passing testing and inspection may then be shipped to customers as packaged die products for integration in appropriate applications (e.g., involving board mounting based on a secondary reflow of the solder balls 919).

While various examples of the present disclosure have been described above, they have been presented by way of example only and not limitation. Numerous changes to the disclosed examples can be made in accordance with the disclosure herein without departing from the spirit or scope of the disclosure. Thus, the breadth and scope of the present disclosure should not be limited by any of the above described examples. Rather, the scope of the disclosure should be defined in accordance with the claims appended hereto and their equivalents.

Further, in at least some additional or alternative implementations, the functions/acts described in the blocks may occur out of the order shown in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Also, some blocks in the flowcharts may be optionally omitted. Furthermore, although some of the diagrams include arrows on communication paths to show a primary direction of communication, it is to be understood that communication may occur in the opposite direction relative to the depicted arrows. Finally, other blocks may be added/inserted between the blocks that are illustrated.

The order or sequence of the acts, steps, functions, components or blocks illustrated in any of the flowcharts and/or block diagrams depicted in the drawing Figures of the present disclosure may be modified, altered, replaced, customized or otherwise rearranged within a particular flowchart or block diagram, including deletion or omission of a particular act, step, function, component or block. Moreover, the acts, steps, functions, components or blocks illustrated in a particular flowchart may be inter-mixed or otherwise inter-arranged or rearranged with the acts, steps, functions, components or blocks illustrated in another flowchart in order to effectuate additional variations, modifications and configurations with respect to one or more processes for purposes of practicing the teachings of the present disclosure. Likewise, although various examples have been set forth herein, not all features of a particular example are necessarily limited thereto and/or required therefor.

At least some portions of the foregoing description may include certain directional terminology, such as, "upper", "lower", "top", "bottom", "left-hand", "right-hand", "front side", "backside", "vertical", "horizontal", etc., which may be used with reference to the orientation of some of the Figures or illustrative elements thereof being described. Because components of some examples can be positioned in a number of different orientations, the directional terminology is used for purposes of illustration and is in no way limiting. Likewise, references to features referred to as "first", "second", etc., are not indicative of any specific order, importance, and the like, and such references may be interchanged, depending on the context, implementation, etc. Further, the features of examples described herein may be combined with each other unless specifically noted otherwise.

Although various implementations have been shown and described in detail, the claims are not limited to any particular implementation or example. None of the above Detailed Description should be read as implying that any particular component, element, step, act, or function is essential such that it must be included in the scope of the claims. Where the phrases such as "at least one of A and B" or phrases of similar import are recited or described, such a phrase should be understood to mean "only A, only B, or both A and B." Reference to an element in the singular is not intended to mean "one and only one" unless explicitly so stated, but rather "one or more." In similar fashion, phrases such as "a plurality" or "multiple" may mean "one or more" or "at least one", depending on the context. All structural and functional equivalents to the elements of the above-described implementations are expressly incorporated herein by reference and are intended to be encompassed by the claims appended below.

What is claimed is:

1. An integrated circuit solder ball mounting apparatus, comprising:
- a ball storage unit for storing solder balls;
- a ball buffer unit configured to receive the solder balls from the ball storage unit in response to one or more pressure-actuated actions; and
- a gate valve configured to simultaneously release the solder balls from the ball buffer unit,
- wherein the ball storage unit is calibrated to hold a first fixed plurality of the solder balls and the ball buffer unit is calibrated to hold a second fixed plurality of the solder balls, the second fixed plurality greater than the first fixed plurality.

2. The apparatus as recited in claim 1, further comprising a gas supply unit coupled to the ball storage unit via a gas supply path including a valve configured to allow passage of a gas volume to cause the one or more pressure-actuated actions in response to a fill signal generated by a controller.

3. The apparatus as recited in claim 2, wherein the gate valve is operable responsive to a dispense signal, different than the fill signal, generated by the controller to cause opening of a ball dispense path connected to the ball buffer unit for facilitating transfer of the solder balls to a ball mounting brush.

4. The apparatus as recited in claim 3, wherein the gate valve is actuated by a controlled flow of a clean dry air (CDA) stream.

5. The apparatus as recited in claim 1, wherein the ball buffer unit is configured to direct the solder balls to a ball mounting brush that is configured to place the solder balls onto area array contact structures located on an integrated circuit.

6. A solder ball transfer device, comprising:
- a path from a solder ball source to an intermediate solder ball storage volume;
- a gas flow path directly connected to the intermediate solder ball storage volume; and
- a solder ball buffer volume connected between the intermediate solder ball storage volume and an outlet valve, the solder ball buffer volume configured to receive solder balls from the intermediate solder ball storage volume via an upward sloping channel in response to one or more solder ball transfer events that include directing a gas flow to the intermediate solder ball storage volume,
- wherein the outlet valve is configured to simultaneously release the solder balls from the solder ball buffer volume, and
- wherein the intermediate solder ball storage volume, the solder ball buffer volume and the upward sloping channel are formed within a single material block forming the solder ball transfer device.

7. The solder ball transfer device as recited in claim 6, wherein the intermediate solder ball storage volume has a bottom higher than a bottom of the solder ball buffer volume.

8. The solder ball transfer device as recited in claim 6, wherein the gas flow path includes a gas channel formed within the single material block.

9. The apparatus as recited in claim 6, wherein the ball buffer volume is calibrated to store a fixed plurality of the solder balls.

10. A machine, comprising:

a ball storage unit for storing solder balls, the ball storage unit having a bottom at a first level;

a ball buffer tank configured to receive the solder balls from the ball storage unit in response to a gas flow into the ball storage unit; and a gate valve at a second level below the first level, the gate valve configured to simultaneously release the solder balls from the ball buffer tank, wherein the ball storage unit is calibrated to hold a first fixed plurality of the solder balls and the ball buffer tank is calibrated to hold a second fixed plurality of the solder balls, the second fixed plurality greater than the first fixed plurality.

11. The machine as recited in claim 10, wherein the gate valve is configured to release the solder balls to a ball mounting brush.

12. The machine as recited in claim 10, wherein the ball storage unit and the ball buffer tank are connected by an upward sloping channel.

13. The machine as recited in claim 12, wherein the ball storage unit, the ball buffer tank and the upward sloping channel are machined in a single material block.

14. A machine, comprising:

a ball storage unit for storing a plurality of solder balls, the ball storage unit having a bottom at a first level;

a ball buffer tank configured to receive the plurality of solder balls from the ball storage unit in response to a gas flow into the ball storage unit; and a gate valve at a second level below the first level, the gate valve configured to simultaneously release the plurality of solder balls from the ball buffer tank, wherein the ball storage unit and the ball buffer tank are connected by an upward sloping channel, and the ball storage unit, the ball buffer tank and the upward sloping channel being machined in a single material block.

15. The machine as recited in claim 14, further comprising a gas supply unit coupled to the ball storage unit via a gas supply path including a valve configured to allow passage of a gas volume to cause the plurality of solder balls to transfer from the ball storage unit to the ball buffer tank.

* * * * *